(12) United States Patent
Urano et al.

(10) Patent No.: US 9,680,075 B2
(45) Date of Patent: Jun. 13, 2017

(54) LIGHT-EMITTING DEVICE

(71) Applicant: PANASONIC CORPORATION, Osaka (JP)

(72) Inventors: Yoji Urano, Osaka (JP); Akifumi Nakamura, Osaka (JP); Hayato Ioka, Osaka (JP); Toru Hirano, Osaka (JP); Masanori Suzuki, Osaka (JP); Hideaki Hyuga, Osaka (JP); Ryoji Imai, Osaka (JP); Jun Goda, Osaka (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 0 days.

(21) Appl. No.: 14/388,963

(22) PCT Filed: Aug. 30, 2013

(86) PCT No.: PCT/JP2013/005132
§ 371 (c)(1),
(2) Date: Sep. 29, 2014

(87) PCT Pub. No.: WO2014/034131
PCT Pub. Date: Mar. 6, 2014

(65) Prior Publication Data
US 2015/0048402 A1 Feb. 19, 2015

(30) Foreign Application Priority Data

Aug. 31, 2012 (JP) ................................. 2012-191743
Nov. 2, 2012 (JP) ................................. 2012-242687

(51) Int. Cl.
*H01L 33/00* (2010.01)
*H01L 33/60* (2010.01)
(Continued)

(52) U.S. Cl.
CPC ............ *H01L 33/60* (2013.01); *H01L 33/502* (2013.01); *H01L 33/52* (2013.01); *H01L 33/62* (2013.01);
(Continued)

(58) Field of Classification Search
CPC ... H01L 25/0753; H01L 33/60; H01L 33/502; H01L 33/52; H01L 33/62; H01L 33/486;
(Continued)

(56) References Cited

U.S. PATENT DOCUMENTS

| 8,421,111 | B2 | 4/2013 | Matsuda et al. |
| 2011/0233601 | A1 | 9/2011 | Nakayama |

(Continued)

FOREIGN PATENT DOCUMENTS

| JP | 11-112025 | 4/1999 |
| JP | 2005-191196 A | 7/2005 |

(Continued)

OTHER PUBLICATIONS

Search report from PCT/JP2013/005132, mail date is Sep. 24, 2013.
European Search Report from E.P.O., mail date is Feb. 16, 2015.

*Primary Examiner* — Trung Q Dang
*Assistant Examiner* — Patricia Reddington
(74) *Attorney, Agent, or Firm* — Greenblum & Bernstein, P.L.C.

(57) ABSTRACT

A light-emitting device in accordance with the present invention includes a mounting substrate; an LED chip bonded to a surface of the mounting substrate with a bond; and an encapsulating portion covering the LED chip. The bond transmits light from the LED chip. The mounting substrate includes: a light-transmissive member having a planar size larger than that of the LED chip; and first and second penetrating wirings which penetrate the light-transmissive member in the thickness direction thereof and are
(Continued)

electrically connected to first and second electrodes of the LED chip via first and second wires, respectively. The light-transmissive member includes at least two light-transmissive layers with different optical properties which are stacked in the thickness direction. A light-transmissive layer of the light-transmissive layers which is farther from the LED chip is higher in reflectance to the light.

8 Claims, 18 Drawing Sheets

(51) Int. Cl.

| | | |
|---|---|---|
| *H01L 33/62* | (2010.01) | |
| *H01L 33/50* | (2010.01) | |
| *H01L 33/52* | (2010.01) | |
| H01L 25/075 | (2006.01) | |
| H01L 33/48 | (2010.01) | |
| F21K 9/00 | (2016.01) | |
| F21S 8/02 | (2006.01) | |
| F21V 29/76 | (2015.01) | |
| F21V 29/89 | (2015.01) | |
| F21Y 101/00 | (2016.01) | |
| F21K 9/27 | (2016.01) | |
| F21Y 103/10 | (2016.01) | |
| F21Y 115/10 | (2016.01) | |

(52) U.S. Cl.
CPC ...... *F21K 9/00* (2013.01); *F21K 9/27* (2016.08); *F21S 8/02* (2013.01); *F21V 29/763* (2015.01); *F21V 29/89* (2015.01); *F21Y 2101/00* (2013.01); *F21Y 2103/10* (2016.08); *F21Y 2115/10* (2016.08); *H01L 25/0753* (2013.01); *H01L 33/486* (2013.01); *H01L 2224/45124* (2013.01); *H01L 2224/45139* (2013.01); *H01L 2224/45144* (2013.01); *H01L 2224/45147* (2013.01); *H01L 2224/48091* (2013.01); *H01L 2224/73265* (2013.01); *H01L 2924/181* (2013.01); *H01L 2933/0058* (2013.01); *H01L 2933/0091* (2013.01)

(58) Field of Classification Search
CPC . H01L 2224/45139; H01L 2224/45144; H01L 2224/45147; H01L 2224/48091; H01L 2224/73265; H01L 2924/181; H01L 2933/0058; H01L 2933/0091; H05K 1/0306; F21V 29/763; F21V 29/89; F21Y 2103/10; F21Y 2115/10; F21Y 2101/00; F21K 9/27; F21K 9/00; F21S 8/02
USPC .......................................................... 257/98
See application file for complete search history.

(56) References Cited

U.S. PATENT DOCUMENTS

| | | | |
|---|---|---|---|
| 2012/0235181 A1 | 9/2012 | Matsuda et al. | |
| 2012/0256538 A1 | 10/2012 | Takeuchi et al. | |
| 2012/0320601 A1* | 12/2012 | Motoya | H01L 25/0753 362/296.01 |
| 2013/0242565 A1* | 9/2013 | Arai et al. | 362/296.04 |
| 2014/0138724 A1* | 5/2014 | Hitomi et al. | 257/98 |

FOREIGN PATENT DOCUMENTS

| | | | |
|---|---|---|---|
| JP | 2005-209958 | | 8/2005 |
| JP | 2006-073699 A | | 3/2006 |
| JP | 2007-048969 | | 2/2007 |
| JP | 2007048969 A | * | 2/2007 |
| JP | 2009-186734 A | | 8/2009 |
| JP | 2009-206200 | | 9/2009 |
| JP | 2010-195655 | | 9/2010 |
| JP | 2011-151187 | | 8/2011 |
| JP | 2012-109513 A | | 6/2012 |
| WO | 2011/142097 | | 11/2011 |
| WO | 2012/060049 A1 | | 5/2012 |
| WO | 2012/070648 | | 5/2012 |
| WO | 2012/090350 A1 | | 7/2012 |

* cited by examiner

LIGHT-EMITTING DEVICE

TECHNICAL FIELD

The present invention relates to light-emitting devices.

BACKGROUND ART

Heretofore, as disclosed in Patent Document 1 (JP 1999-112025 A), a chip-type light-emitting element having a configuration shown in FIG. 25 has been proposed. The chip-type light-emitting element includes an insulating substrate 201, an LED chip 206 that is mounted on a surface of the insulating substrate 201, and a package 207 which covers the LED chip 206 and surroundings thereof. In the chip-type light-emitting element, an n-type electrode 239 and a p-type electrode 238 are connected to a first terminal electrode 211 and a second terminal electrode 212 via gold wires 204, respectively.

Patent Document 1 discloses that blue light propagating toward the back face of the substrate of the LED chip 206 can be reflected by the insulating substrate 201 that is a white insulating substrate composed of ceramics such as alumina and aluminum nitride.

In the chip-type light-emitting element having the configuration shown in FIG. 25, blue light that propagates toward the back face of the substrate of the LED chip 206 is reflected by the insulating substrate 201. It is speculated that light outcoupling efficiency decreases due to absorption, multiple reflection, and the like of the light in the LED chip 206.

SUMMARY OF INVENTION

The present invention has been made in view of the above-described insufficiencies, and an object of the present invention is to provide a light-emitting device with improved light outcoupling efficiency.

According to the first aspect of the present embodiment, there is provided a light-emitting device including a mounting substrate, an LED chip, and an encapsulating portion. The LED chip is bonded to a surface of the mounting substrate with a bond. The encapsulating portion covers the LED chip on the surface of the mounting substrate. The bond allows light emitted from the LED chip to pass therethrough. The mounting substrate includes: a light-transmissive member having a planar size larger than a planar size of the LED chip; a first penetrating wiring; and a second penetrating wiring. The first penetrating wiring penetrates the light transmissive member in a thickness direction of the light transmissive member and is electrically connected to a first electrode of the LED chip via a first wire. The second penetrating wiring penetrates the light transmissive member in the thickness direction and is electrically connected to a second electrode of the LED chip via a second wire. The encapsulating portion covers the first wire and the second wire. The light-transmissive member is constituted by at least two light-transmissive layers which are stacked in the thickness direction. The at least two light-transmissive layers have different optical properties. A light-transmissive layer of the at least two light-transmissive layers which is farther from the LED chip is higher in reflectance to the light emitted from the LED chip.

According to the second aspect of the present invention referring to the first aspect, there is provided a light-emitting device in which the light-transmissive member allows light, which is emitted from the LED chip and enters the light-transmissive member, to be diffusely reflected at an interface between the at least two light-transmissive layers.

According to the third aspect of the present invention referring to the first or second aspect, there is provided a light-emitting device in which: the light-transmissive member includes a first light-transmissive layer and a second light-transmissive layer of the at least two light-transmissive layers, the second light-transmissive layer being farther from the LED chip than the first light-transmissive layer is; and the light-transmissive member allows light to be diffused at the second light-transmissive layer.

According to the fourth aspect of the present invention referring to any one of the first to third aspects, there is provided a light-emitting device in which: the light-transmissive member includes a first light-transmissive layer and a second light-transmissive layer of the at least two light-transmissive layers, the second light-transmissive layer being farther from the LED chip than the first light-transmissive layer is; the first light-transmissive layer has a higher light transmittance than the second light-transmissive layer; and the second light-transmissive layer has a higher light scattering rate than the first light-transmissive layer.

According to the fifth aspect of the present invention referring to any one of the first to fourth aspects, there is provided a light-emitting device in which: the light-transmissive member includes a first light-transmissive layer and a second light-transmissive layer of the at least two light-transmissive layers, the second light-transmissive layer being farther from the LED chip than the first light-transmissive layer is; and the first light-transmissive layer is thicker than the second light-transmissive layer.

According to the sixth aspect of the present invention referring to any one of the first to fifth aspects, there is provided a light-emitting device in which each of the light-transmissive layers is a ceramic layer.

According to the seventh aspect of the present invention referring to the sixth aspect, there is provided a light-emitting device in which: the light-transmissive member includes a first light-transmissive layer and a second light-transmissive layer of the at least two light-transmissive layers, the second light-transmissive layer being farther from the LED chip than the first light-transmissive layer is; and the second light-transmissive layer is formed by sintering at a lower temperature than a temperature for sintering of the first light-transmissive layer.

According to the eighth aspect of the present invention referring to the seventh aspect, there is provided a light-emitting device in which: the first light-transmissive layer is formed by sintering at a temperature of 1500° C. or more but 1600° C. or less; and the second light-transmissive layer is formed by sintering at a temperature of 850° C. or more but 1000° C. or less.

According to the ninth aspect of the present invention referring to any one of the first to eighth aspects, there is provided a light-emitting device in which: the encapsulating portion contains a transparent material and a wavelength conversion material; and the wavelength conversion material is a fluorescent material which is excited by the light emitted from the LED chip to emit light having a different color from a color of the light emitted from the LED chip.

DESCRIPTION OF EMBODIMENTS

Embodiment 1

Figure 1:
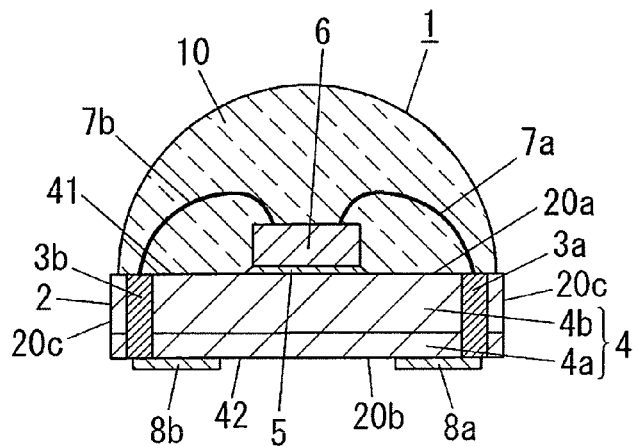
FIG. 1 is a schematic cross-section of a light-emitting device of Embodiment 1.
Figure 2:
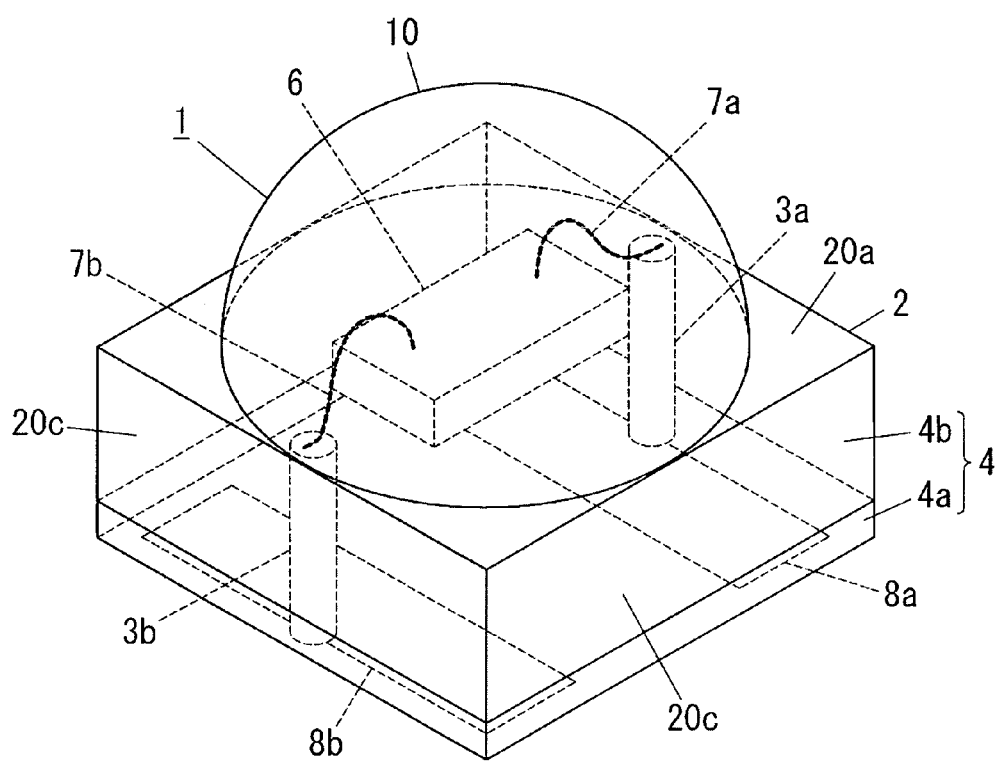
FIG. 2 is a schematic perspective view of the light-emitting device of Embodiment 1.
Figure 3:
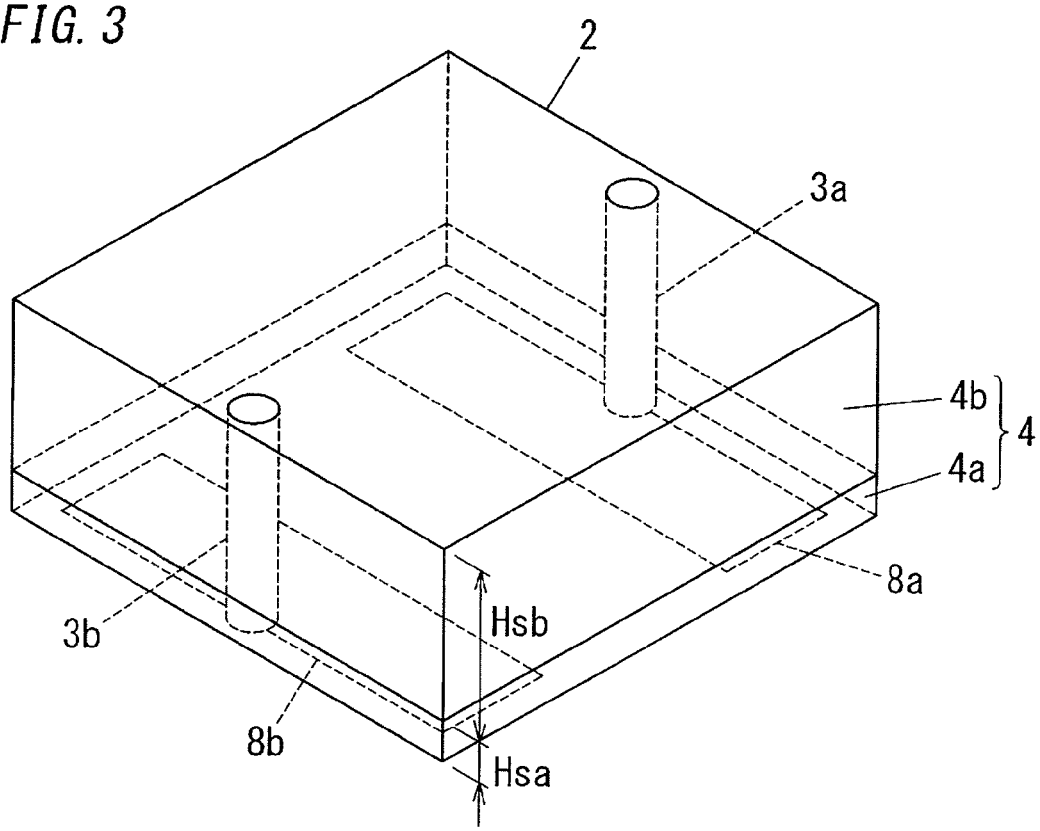
FIG. 3 is a schematic perspective view of a mounting substrate of the light-emitting device of Embodiment 1.

Hereinafter, a light-emitting device 1 of the present embodiment will be described with reference to FIGS. 1 to 4.

The light-emitting device 1 includes a mounting substrate 2, an LED chip 6 which is bonded to a surface 20a of the mounting substrate 2 with a bond 5, and an encapsulating portion 10 covering the LED chip 6 on the surface 20a of the mounting substrate 2.

The mounting substrate 2 includes: a light-transmissive member 4; a first penetrating wiring 3a electrically connected to a first electrode (not shown) of the LED chip 6 via a first wire 7a; and a second penetrating wiring 3b electrically connected to a second electrode (not shown) of the LED chip 6 via a second wire 7b. The light-transmissive member 4 propagates incident light to the outside through refraction or internal diffusion (scattering).

The light-transmissive member 4 has a plate shape having a greater planar size than a chip size of the LED chip 6. The first penetrating wiring 3a and the second penetrating wiring 3b both penetrate the light-transmissive member 4 in a thickness direction of the light-transmissive member 4. Note that, in the light-emitting device 1, the mounting substrate 2 and the encapsulating portion 10 constitute a package.

The encapsulating portion 10 encapsulates the LED chip 6, the first wire 7a, and the second wire 7b.

The bond 5 allows light emitted from the LED chip 6 to pass therethrough.

The light-transmissive member 4 includes at least two light-transmissive layers stacked in the thickness direction of the light-transmissive member 4. In Embodiment 1, the light-transmissive member 4 includes two light-transmissive layers (a first light-transmissive layer 4b and a second light-transmissive layer 4a). The second light-transmissive layer 4a is farther from the LED chip 6 than the first light-transmissive layer 4b is. In other words, the first light-transmissive layer 4b is closer to the LED chip 6 than the second light-transmissive layer 4a is. Besides, the second light-transmissive layer 4a is higher in reflectance to the light emitted from the LED chip 6 than the first light-transmissive layer 4b.

Particularly, in the present embodiment, each of the light-transmissive layers 4a and 4b is made of a ceramic. That is, the light-transmissive member 4 is composed of two ceramic layers 4a and 4b which are stacked in the thickness direction of the light-transmissive member 4. In the light-transmissive member 4, the ceramic layers 4a and 4b have different optical properties, and the ceramic layer 4a which is farther from the LED chip 6 is higher in reflectance to the light emitted from the LED chip 6. In this regard, the optical properties refer to reflectance, transmittance, absorptance, or the like.

The light-transmissive member 4 is constituted by at least two light-transmissive layers stacked in the thickness direction and have such a property that optical properties of the light-transmissive layers differ from each other, and a light-transmissive layer of the plurality of light-transmissive layers which is farther from the LED chip 6 is higher in reflectance to the light emitted from the LED chip 6.

Accordingly, in the light-emitting device 1, part of the light emitted from a light-emitting layer (not shown) in the LED chip 6 passes through the LED chip 6 and the bond 5, and thereafter is diffused inside the light-transmissive member 4. Consequently, the light that has passed through the LED chip 6 and the bond 5 is less likely to be totally reflected, and more likely to emerge from the mounting substrate 2 through either side faces 20c or the surface 20a. Therefore, in the light-emitting device 1, light outcoupling efficiency can be improved and a total light flux amount can be increased.

Hereinafter, each constituent element of the light-emitting device 1 will be described in detail.

The LED chip 6 includes a first electrode serving as an anode electrode and a second electrode (not shown) serving as a cathode electrode both at a face (first face) 6a of the LED chip 6 in the thickness direction of the LED chip 6.

Figure 4:
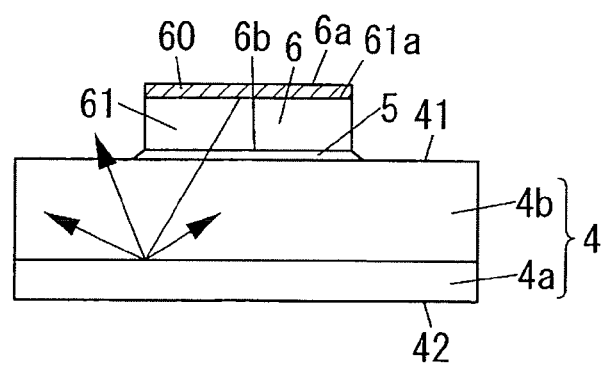
FIG. 4 is a schematic explanatory diagram of a propagating path of light in the light-emitting device of Embodiment 1.

The LED chip 6 includes, as shown in FIG. 4, a substrate 61 and an LED structure portion 60 on a main surface 61a of the substrate 61. The LED structure portion 60 includes an n-type semiconductor layer, a light-emitting layer, and a p-type semiconductor layer. The substrate 61 is transparent to light emitted from the light-emitting layer. The substrate 61 is situated closer to the light-transmissive member 4 than to the LED structure portion 60. That is, the main surface 61a is an opposite face of the substrate 61 from the light-transmissive member 4 (mounting substrate 2). In other words, the LED chip 6 includes the LED structure portion 60 and the substrate 61, and the LED structure portion 60 is on the substrate 61 which is situated over the light-transmissive member 4. The stacking order of the n-type semiconductor layer, the light-emitting layer, and the p-type semiconductor layer is the n-type semiconductor layer, the light-emitting layer, and the p-type semiconductor layer from the substrate 61. The stacking order is not limited thereto, however, and the stacking order may be the p-type semiconductor layer, the light-emitting layer, and the n-type semiconductor layer from the substrate 61. The LED chip 6 more preferably has a structure in which a buffer layer is provided between the LED structure portion 60 and the substrate 61. The light-emitting layer preferably has a single quantum well structure or a multiple quantum well structure, but is not limited thereto. For example, the LED chip 6 may have a double-hetero structure configured by the n-type semiconductor layer, the light-emitting layer, and the p-type semiconductor layer. Note that, the structure of the LED chip 6 is not particularly limited. An LED module 20 may be an LED chip including a reflector such as a Bragg reflector.

The LED chip 6 is a GaN-based blue LED chip which emits blue light. In the blue LED chip, a gallium nitride-based material is used as a material for the light-emitting layer, and a sapphire substrate serves as the substrate 61. Note that, the substrate 61 of the LED chip 6 is not limited to the sapphire substrate, and the substrate 61 may be a transparent substrate with respect to light which is emitted from the light-emitting layer.

The chip size of the LED chip 6 is not particularly limited. The LED chip 6 may have a chip size of 0.3 mm sq. (0.3 mm by 0.3 mm), 0.45 mm sq., 1 mm sq., or the like. Also, the planar shape of the LED chip 6 is not limited to a square shape, and, for example, may be a rectangular shape. When the planar shape of the LED chip 6 is a rectangular shape, the chip size of the LED chip 6 may be 0.5 mm by 0.24 mm, 0.5 mm by 1.0 mm, or the like.

In the LED chip 6, the material and the emission color of the light-emitting layer is not particularly limited. That is, the LED chip 6 is not limited to a blue LED chip, and may be a violet LED chip, an ultraviolet LED chip, a red LED chip, a green LED chip, or the like.

The bond 5 may be formed of a transparent material such as a silicone resin and an epoxy resin. In the light-emitting device 1, the LED chip 6 is bonded to a center of the surface 20a of the mounting substrate 2 with the bond 5. Besides, in the light-emitting device 1, the LED chip 6 is bonded to a center of a surface (first surface) 41 of the light-transmissive member 4 with the bond 5.

On the mounting substrate 2, at a further surface (second surface) 42 of the light-transmissive member 4, provided are a first external electrode 8a and a second external electrode 8b for supplying power to the LED chip 6. The first surface 41 and the second surface 42 are perpendicular to the thickness direction of the light-transmissive member 4. The first electrode of the LED chip 6 is electrically connected to the first external electrode 8a via the first wire 7a and the first penetrating wiring 3a. Besides, the second electrode of the LED chip 6 is electrically connected to the second external electrode 8b via the second wire 7b and the second penetrating wiring 3b.

Each of the wires 7a and 7b may be a gold wire, a silver wire, a copper wire, or an aluminum wire.

The first external electrode 8a and the second external electrode 8b may be made of gold, platinum, molybdenum, tungsten, cupper, aluminum, or aluminum alloy. The first external electrode 8a and the second external electrode 8b may have a single-layer structure or a multilayer structure, but preferably has an outermost surface made of gold.

The first penetrating wiring 3a and the second penetrating wiring 3b may be made of gold, platinum, molybdenum, tungsten, cupper, aluminum, or aluminum alloy. Each of the first penetrating wiring 3a and the second penetrating wiring 3b may be entirely made of a single material or may be made of materials to have a part in the ceramic layer 4b and a further part in the ceramic layer 4a which are made of different materials.

The light-transmissive member 4 is light-transmissive and light-diffusive to light in an ultraviolet wavelength region and a visible wavelength region. As shown schematically by arrows in FIG. 4, the light-transmissive member 4 transmits and diffuses light which is emitted from the light-emitting layer of the LED structure portion 60 of the LED chip 6.

In the light-transmissive member 4, the ceramic layers 4a and 4b have different optical properties from each other, and the ceramic layer 4a, which is farther from the LED chip 6, is higher in reflectance with respect to the light emitted from the LED chip 6, as described above.

Accordingly, in the light-emitting device 1, light emitted from the light-emitting layer of the LED structure portion 60 of the LED chip 6 toward a further face (second face) 6b (a face opposite from the first face 6a at which the first and second electrodes are provided) of the LED chip 6 in the thickness direction is more likely to be reflected at an interface between the ceramic layer 4b and the ceramic layer 4a as shown schematically by arrows in FIG. 4. That is, in the light-transmissive member 4, it is possible to diffusely reflect light, which is emitted from the LED chip 6 and then enters the light-transmissive member 4, at an interface between the light-transmissive layers. Therefore, in the light-emitting device 1, it is possible to prevent light, which is emitted from the LED chip 6 toward the light-transmissive member 4, from returning to the LED chip 6 and to prevent the light from entering the first external electrode 8a and the second external electrode 8b which are on the further surface (second surface) 42 of the light-transmissive member 4. As a result, light can be more easily extracted from the surface (first surface) 41 and the side faces of the light-transmissive member 4. In brief, parts of light, which is emitted from the light-emitting layer of the LED chip 6 towards the light-transmissive member 4, emerge from the light-transmissive member 4 through the first surface 41 (surface closer to the LED chip 6) or either side faces. In other words, light, which is emitted from the LED chip 6 and then enters the surface 20a of the mounting substrate 2, is diffused in the light-transmissive member 4 and then emerges from the surface 20a (namely, the same as the surface which the light struck) of the mounting substrate 2. Besides, in Embodiment 1, the light-transmissive member 4 includes a plurality of light-transmissive layers and can cause diffuse reflection of light at the interface of the light-transmissive layers. Accordingly, it is possible to prevent light, which is emitted from the LED chip 6 and then strikes the surface 20a of the mounting substrate 2, from returning to the LED chip 6 and to allows the light to emerge from the surface 20a (namely, same as the surface which the light struck) of the mounting substrate 2. Note that the light diffused in the light-transmissive member 4 can emerge not only from the surface 20a of the mounting substrate 2 but also from side surfaces 20c of the mounting substrate 2. The light outcoupling efficiency of the light-emitting device 1 can thereby be improved. Besides, it is possible to reduce influences of the reflectance of the first external electrode 8a, the reflectance of the second external electrode 8b, and the reflectance of a circuit substrate (not shown) on which the light-emitting device 1 is to be mounted, and therefore it is possible to improve degree of freedom in terms of materials of the first external electrode 8a, second external electrode 8b, and the circuit substrate. For example, when the circuit substrate includes an organic-based substrate or a metal plate and a mask layer composed of a white mask thereon, the reflectance of the circuit substrate is prone to decrease with time. Accordingly, there is a concern that the light outcoupling efficiency may decrease with time greatly. In contrast, in the light-emitting device 1 of Embodiment 1, it is possible to reduce influences of the reflectance of the circuit substrate on the light outcoupling efficiency, and therefore to suppress deterioration with time in the light outcoupling efficiency.

The light-transmissive member 4 has a rectangular shape in a planar view, but the shape is not limited thereto, and may be a round shape, a polygonal shape other than a rectangle, or the like. The planar size of the light-transmissive member 4 is set to be larger than the planar size of the LED chip 6. Accordingly, light outcoupling efficiency of the light-emitting device 1 can be improved. Note that, in Embodiment 1, the surface 20a of the mounting substrate 2 is the first surface 41 of the light-transmissive member 4.

The light-transmissive member 4 preferably has a stress alleviation function of alleviating stress which acts on the LED chip 6 caused by the difference between the linear expansion coefficients of the LED chip 6 and the circuit substrate. The stress alleviation function is provided by designing the light-transmissive member 4 to have a linear expansion coefficient close to that of the LED chip 6. Accordingly, in the light-emitting device 1, it is possible to alleviate the stress which acts on the LED chip 6 caused by the difference between the linear expansion coefficients of the LED chip 6 and the circuit substrate.

The light-transmissive member 4 preferably has a heat conduction function of conducting heat which is generated in the LED chip 6 toward the circuit substrate which is to be connected to the further surface (second surface) 42 of the light-transmissive member 4 or the like. Also, the light-transmissive member 4 preferably has a heat conduction function of conducting heat which is generated in the LED chip 6 to a region which is larger than the chip size of the LED chip 6. Accordingly, in the light-emitting device 1, heat generated in the LED chip 6 can be efficiently dissipated via the light-transmissive member 4.

The encapsulating portion 10 is made of a material containing a transparent material and a fluorescent material. The fluorescent material is excited by light emitted from the LED chip 6 to emit light having a different color from a color of the light emitted from the LED chip 6.

The transparent material for the encapsulating portion 10 may be, for example, a silicone resin, an epoxy resin, an acrylic resin, glass, or an organic and inorganic hybrid material in which an organic component and an inorganic component are mixed and/or combined at a nm level or molecular level.

The fluorescent material for the encapsulating portion 10 functions as a wavelength conversion material that converts the light emitted from the LED chip 6 to light having longer wavelength than the light emitted from the LED chip 6. Accordingly, the light-emitting device 1 can emit mixed-color light constituted by the light emitted from the LED chip 6 and the light emitted from the fluorescent material.

For example, when the LED chip 6 is a blue LED chip and the fluorescent material of the wavelength conversion material is a yellow fluorescent material, the light-emitting device 1 can provide white light. That is, blue light that is emitted from the LED chip 6 and light that is emitted from the yellow fluorescent material can pass through the LED chip 6 and the light-transmissive member 4, and as a result the light-emitting device 1 can emit white light.

The fluorescent material serving as the wavelength conversion material is not limited to the yellow fluorescent material, and may include, for example, a set of a yellow fluorescent material and a red fluorescent material, or a set of a red fluorescent material and a green fluorescent material. Also, the fluorescent material serving as the wavelength conversion material is not limited to one kind of yellow fluorescent material, and may include two kinds of yellow fluorescent materials having different emission peak wavelengths. The color rendering property of the light-emitting device 1 can be improved by use of a plurality of fluorescent materials as the wavelength conversion material.

In the light-emitting device 1, the encapsulating portion 10 is preferably formed in a hemispherical shape. Accordingly, it is possible to suppress color unevenness.

The shape of the encapsulating portion 10 is hemispheric, but is not limited to this, and may be a semi-ellipse, or semicircular column, for example.

In the light-emitting device 1, the encapsulating portion 10 may contain a light diffusion material. The light diffusion material is preferably composed of particles and dispersed in the encapsulating portion 10. In the light-emitting device 1, due to the encapsulating portion 10 containing the light diffusion material, color unevenness can be further suppressed. The material of the light diffusion material may be an inorganic material such as aluminum oxide, silica, titanium oxide, and Au, an organic material such as a fluorine based resin, an organic and inorganic hybrid material in which an organic component and an inorganic component are mixed and/or combined at a nanometer level or molecular level, or the like. In the light-emitting device 1, the larger the difference between the refractive indices of the light diffusion material and the transparent material of the encapsulating portion 10, the smaller the light diffusion material content required to obtain an effect to suppress color unevenness to a similar level.

It is possible to further improve the color rendering property of the light-emitting device 1 by that the LED chip 6 is a blue LED chip and the encapsulating portion 10 contains a plurality of fluorescent materials (green fluorescent material and red fluorescent material) and the light diffusion material. Furthermore, it is possible to further improve the color rendering property of the light-emitting device 1 by that the LED chip 6 is an ultraviolet LED chip and the encapsulating portion 10 contains a plurality of kinds of fluorescent materials (blue fluorescent material, green fluorescent material, and red fluorescent material) and the light diffusion material.

The following description is made to describe the light-transmissive member 4 in further detail. For convenience of description, the uppermost light-transmissive layer (ceramic layer) 4b that is the closest to the LED chip 6 may be referred to as a first ceramic layer 4b, and the lowermost light-transmissive (ceramic layer) 4a that is the farthest from the LED chip 6 may be referred to as a second ceramic layer 4a. When the light-transmissive member 4 includes three or more light-transmissive layers, the first light-transmissive layer 4b is the closest layer to the LED chip 6, and the second light-transmissive layer 4a is the farthest layer from the LED chip 6, of the light-transmissive layers of the light-transmissive member 4.

The first light-transmissive layer 4b is preferably composed of a material that has high transmittance with respect to the light emitted from the LED chip 6, and has a refractive index close to the refractive index of the LED chip 6. The refractive index of the first light-transmissive layer 4b being close to the refractive index of the LED chip 6 means that the difference between the refractive index of the first light-transmissive layer and the refractive index of the substrate 61 in the LED chip 6 is 0.1 or less, and is more preferably 0. The first light-transmissive layer 4b is preferably composed of a material having a high thermal resistance.

In Embodiment 1, the first light-transmissive layer 4b is a ceramic layer. The first light-transmissive layer (first ceramic layer) 4b may be made of alumina ($Al_2O_3$), for example. That is, the first ceramic layer 4b may be an alumina substrate, for example. When the first ceramic layer 4b is the alumina substrate, the particle diameter of alumina particles of the alumina substrate is preferably in a range between 1 µm to 30 µm. The larger the particle diameter of the alumina particles, the smaller the reflectance of the first ceramic layer 4b. The smaller the particle diameter of the alumina particles, the larger the scattering effect of the first ceramic layer 4b. In short, reducing the reflectance and increasing the scattering effect are in a trade-off relationship.

The aforementioned particle diameter is determined by a number-size distribution curve. Here, the number-size distribution curve is obtained by measuring a particle size distribution by an imaging method. Specifically, the particle diameter is determined by a particle size (two-axis average diameter) and the number of particles determined by image processing of a SEM image obtained by scanning electron microscope (SEM) observation. In the number-size distribution curve, the particle diameter value at the integrated value of 50% is referred to as a median diameter ($d_{50}$), and the aforementioned particle diameter refers to the median diameter.

Figure 5:
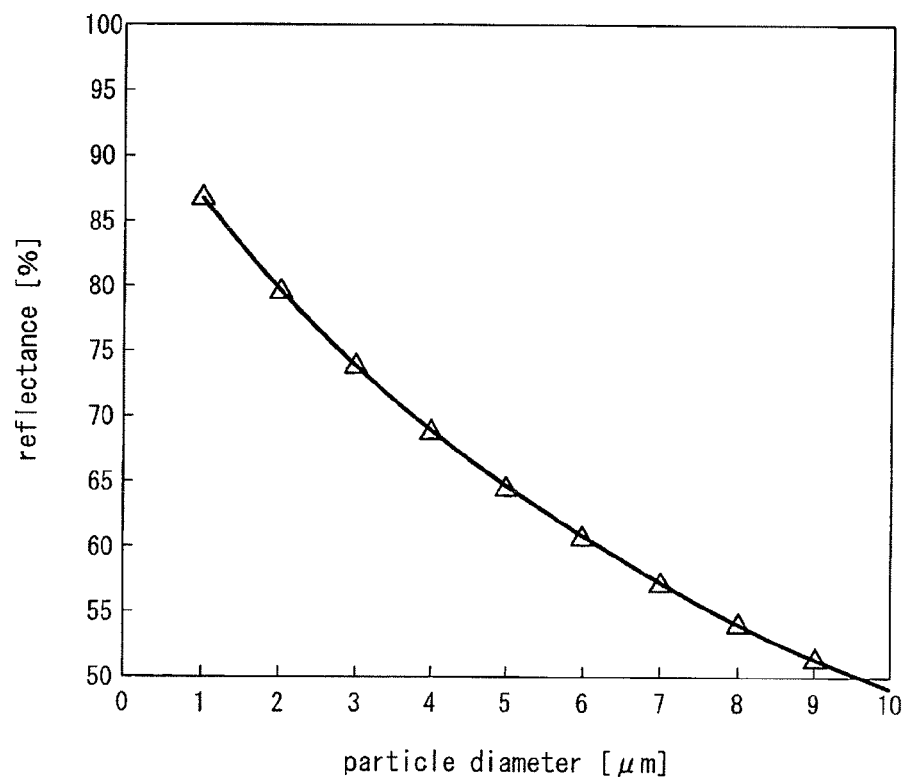
FIG. 5 is an explanatory diagram of the relation between a particle diameter and reflectance of an alumina particle.

Note that, FIG. 5 shows a theoretical relation between the particle diameter and the reflectance of a spherical alumina particle in the alumina substrate. The smaller the particle diameter, the higher the reflectance. The relation of the first ceramic layer 4b between the median diameter ($d_{50}$) and the measured value of reflectance is approximately the same as the theoretical value shown in FIG. 5. The reflectance is measured using a spectrophotometer and an integrating sphere.

The material of the first light-transmissive layer 4b is not limited to ceramics, and may be glass, SiC, GaN, GaP, sapphire, an epoxy resin, a silicone resin, unsaturated polyester, or the like. The material of the ceramics is not limited to $Al_2O_3$, and may be another metal oxide (such as magnesia, zirconia, and titania), a metal nitride (such as aluminum nitride), or the like. As the material of the first light-transmissive layer 4b, ceramics is more preferable than a single crystal from a viewpoint of causing light emitted from the LED chip 6 to be forward-scattered.

The light-transmissive ceramics may be LUMICERA (registered trademark) available from Murata Manufacturing Co., Ltd., HICERAM (product name) available from NGK Insulators, Ltd., or the like. LUMICERA (registered trademark) has a $Ba(Mg,Ta)O_3$-based complex perovskite structure as the main crystal phase. HICERAM is a light-transmissive alumina ceramic. The first light-transmissive layer 4b made of ceramic preferably include particles having the particle diameter of around 1 µm to 5 µm.

The first light-transmissive layer 4b may be a single crystal in which voids, a modified portion having a different refractive index, or the like is formed. The voids, the modified portion, or the like may be formed by irradiating, with a laser beam from a femto-second laser, a scheduled formation region of the voids, the modified portion, or the like in the single crystal. The wavelength and the irradiation conditions of the laser beam from the femto-second laser may vary appropriately according to the material of the single crystal, the forming target (void or modified portion), the size of the forming target, or the like. The first light-transmissive layer 4b may be made of a base resin (such as epoxy resin, silicone resin, and unsaturated polyester) (hereinafter, referred to as "first base resin") which contains a filler (hereinafter, referred to as "first filler") having a refractive index different from the base resin. It is more preferable that a difference between the refractive indices of the first filler and the first base resin is small. The first filler preferably has higher thermal conductivity. The first light-transmissive layer 4b preferably has a high density of the first filler, from a viewpoint of increasing thermal conductivity. The shape of the first filler is preferably a sphere, from a viewpoint of suppressing total reflection of incident light. The larger the particle diameter of the first filler, the smaller the reflectivity and the refractivity thereof. The first light-transmissive layer 4b may be configured such that a first filler having a relatively large particle diameter is present in a region of the first light-transmissive layer 4b close to the LED chip 6 in the thickness direction, and a first filler having a relatively small particle diameter is present in a region thereof distant from the LED chip 6. In this case, the first light-transmissive layer 4b may include a plurality of stacked layers having the first fillers with different particle diameters.

On the surface of the first light-transmissive layer 4b close to the LED chip 6 (the first surface 41 of the light-transmissive member 4), a fine asperity structure portion is preferably formed around the mounting region of the LED chip 6 so as to suppress total reflection of light which is emitted from the LED chip 6 toward the light-transmissive member 4 and is reflected by or refracted in the light-transmissive member 4. The asperity structure portion may be formed by roughening the surface of the first light-transmissive layer 4b by sandblast processing or the like. The surface roughness of the asperity structure portion is preferably such that an arithmetic average roughness Ra specified in JIS B 0601-2001 (ISO 4287-1997) is around 0.05 μm.

The light-transmissive member 4 may have a configuration in which a resin layer having a smaller refractive index than the first light-transmissive layer 4b is formed on the surface of the first light-transmissive layer 4b close to the LED chip 6 around the mounting region of the LED chip 6. The material of the resin layer may be a silicone resin, an epoxy resin, or the like. The material of the resin layer may be a resin containing a fluorescent material.

The second light-transmissive layer 4a is transparent to the light emitted from the LED chip. In Embodiment 1, the second light-transmissive layer 4a is a ceramic layer. The second light-transmissive layer 4a diffusely reflects light emitted from the LED chip 6. That is, the second light-transmissive layer 4a is more preferably configured to diffusely reflect light emitted from the LED chip 6 than to specularly reflect the light.

The second ceramic layer (second light-transmissive layer) 4a may be made of, for example, a composite material that contains $SiO_2$, $Al_2O_3$, a material having a higher refractive index than $Al_2O_3$ (such as $ZrO_2$ and $TiO_2$), CaO, and BaO as components. The particle diameter of $Al_2O_3$ particles of the second ceramic layer 4a is preferably in a range between 0.1 μm and 1 μm. The optical properties (such as reflectance, transmittance, and absorptance) of the second ceramic layer 4a can be adjusted by adjusting components, composition, particle diameter, thickness, or the like of the composite material. In the light-transmissive member 4, when the first ceramic layer 4b and the second ceramic layer 4a are made of the same kind of material, the first ceramic layer 4b should be made of a material having the particle diameter larger than that for the second ceramic layer 4a.

Note that, the material of the second light-transmissive layer 4a is not limited to ceramics, and may be glass, SiC, GaN, GaP, sapphire, an epoxy resin, a silicone resin, unsaturated polyester, or the like. The material of the ceramics is not limited to $Al_2O_3$, and may be another metal oxide (such as magnesia, zirconia, and titania), a metal nitride (such as aluminum nitride), or the like.

In this regard, when each of the first light-transmissive layer 4b and the second light-transmissive layer 4a is made of semiconductor (e.g., SiC, GaN, and GaP), it is preferable that an insulating layer is formed between the first light-transmissive layer 4b and the second light-transmissive layer 4a, and the insulating layer is transparent to the light emitted from the LED chip 6 and has electrical insulation properties.

The second light-transmissive layer 4a made of ceramics preferably includes particles having the particle diameter of 1 μm or less, and more preferably include particles having the particle diameter of around 0.1 μm to 0.3 μm. Also, the second light-transmissive layer may be a porous layer 4a described below. In a case where the first light-transmissive layer 4b was the first ceramic layer 4b composed of alumina having purity of 99.5%, the bulk density of the first light-transmissive layer 4b was 3.8 to 3.95 $g/cm^3$. In a case where the first light-transmissive layer 4b was the first ceramic layer 4b composed of alumina having purity of 96%, the bulk density of the first light-transmissive layer 4b was 3.7 to 3.8 $g/cm^3$. In contrast, in a case where the second light-transmissive layer 4a was the porous layer 4a, the bulk density of the second light-transmissive layer was 3.7 to 3.8 $g/cm^3$. Note that, the aforementioned bulk density is a value estimated by image processing a SEM image observed and obtained by an SEM.

The second light-transmissive layer 4a may be of a single crystal in which a void[s], a modified portion having a different refractive index, or the like is formed. The void, the modified portion, or the like may be formed by irradiating, with a laser beam from a femto-second laser, a scheduled formation region of the void, the modified portion, or the like in the single crystal. The wavelength and the irradiation conditions of the laser beam from the femto-second laser may vary appropriately according to the material of the single crystal, the forming target (void or modified portion), the size of the forming target, or the like. The second light-transmissive layer 4a may be made of a base resin (such as epoxy resin, silicone resin, unsaturated polyester, and a fluorine resin) (hereinafter, referred to as "second base resin") which contains a filler (hereinafter, referred to as "second filler") having a refractive index different from the base resin. The second light-transmissive layer 4a may be configured such that a second filler having a relatively large particle diameter is present in a region of the second light-transmissive layer 4a close to the LED chip 6 in the thickness direction, and a second filler having a relatively small particle diameter is present in a region thereof distant from the LED chip 6. The material of the second filler is preferably, for example, a white inorganic material, and may be a metal oxide such as $TiO_2$ and ZnO. The particle diameter of the second filler is preferably in a range between around 0.1 μm and 0.3 μm, for example. The filling rate of the second filler is preferably in a range of around 50 to 75 wt %, for example. The silicone resin for the second base resin may be methyl silicone, phenyl silicone, or the like. In a case where the second filler is in a form of solid particle, it is preferable that there is a great difference between the refractive indices of the second filler and the second base resin. A material containing the second base resin and the second filler in the second base resin may be KER-3200-T1 available from Shin-Etsu Chemical Co., Ltd. or the like.

The second filler may be a core-shell particle, a hollow particle, or the like. The refractive index of the core of the core-shell particle can be arbitrarily selected, but is preferably smaller than the refractive index of the second base resin. It is preferable that the hollow particle has a smaller refractive index than the second base resin, and that inside of the hollow particle is gas (such as air and inert gas) or vacuum.

The second light-transmissive layer 4a may be a light diffusion sheet. The light diffusion sheet may be a white polyethylene terephthalate sheet having a plurality of bubbles, or the like.

When both the first light-transmissive layer 4b and the second light-transmissive layer 4a are made of ceramics, the light-transmissive member 4 may be formed by sintering a ceramic green sheet to be the first light-transmissive layer 4b, then providing a further ceramic green sheet to be the second light-transmissive layer 4a on the first light-transmissive layer 4b, and subsequently sintering the further green sheet. Note that, in the light-transmissive member 4, provided that the second light-transmissive layer 4a includes bubbles, the first light-transmissive layer 4b may include bubbles. In such a case, it is preferable that the first light-transmissive layer 4b is smaller in the number of bubbles and higher in the bulk density than the second light-transmissive layer 4a.

Each of the first light-transmissive layer 4b and the second light-transmissive layer 4a is preferably composed of a material that has a high resistance to light and heat, which are emitted from the LED chip 6 and the fluorescent material.

The light-emitting device 1 may include a reflection layer over the second surface 42 of the light-transmissive member 4 to reflect light from the LED chip 6 or the like. The reflection layer may be made of silver, aluminum, a silver aluminum alloy, silver alloys other than the silver aluminum alloy, an aluminum alloy, or the like. The reflection layer may be constituted by a thin film, a metal foil, a solder mask (solder), or the like.

In formation of the mounting substrate 2, first, the first external electrode 8a and the second external electrode 8b are formed on the further surface (second surface) 42 of the light-transmissive member 4. Then, the first penetrating wiring 3a and the second penetrating wiring 3b are formed by making a first through hole and a second through hole on scheduled areas for the first penetrating wiring 3a and the second penetrating wiring 3b, respectively, of the light-transmissive member 4, and forming conductive layers in the first through hole and the second through hole, respectively. It is preferable that the first penetrating wiring 3a and the second penetrating wiring 3b are formed, prior to a step of dividing the mounting substrate 2 into pieces.

Figure 6:
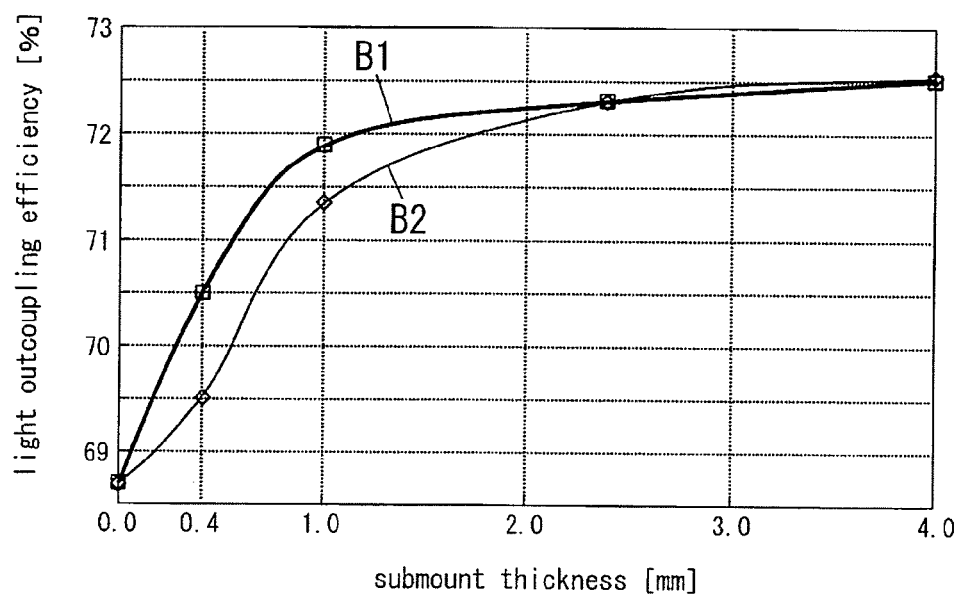
FIG. 6 is an explanatory diagram of a simulation result of the relation between a thickness of a submount and light outcoupling efficiency in a light-emitting device of a comparative example.

Incidentally, the inventors selected, as a comparative example of the light-emitting device 1 of the present embodiment, an LED module in which: the LED chip 6 is bonded to a submount with a first bond; the submount is bonded to a surface of an opaque substrate with a second bond; and the submount is configured by a single layer of alumina substrate. Then, the inventors performed a simulation regarding light outcoupling efficiency of the comparative example of the light-emitting device with a parameter which is the dimension of the submount of the light-emitting device of the comparative example. FIG. 6 shows an example of the results. The simulation is a geometric optical simulation by Monte Carlo ray tracing. Note that, in the simulation, the reflectance of the surface of the opaque substrate and the absorptance of the opaque substrate are assumed to be 95% and 5%, respectively. Also, in the simulation, the chip size of the LED chip 6 is assumed to be 0.5 mm by 0.24 mm. In the simulation, the LED chip 6 is assumed to include the substrate 61 made of sapphire having a refractive index of 1.77 and the LED structure portion 60 made from GaN having a refractive index of 2.5. Besides, the light-emitting layer is assumed to isotropically emit light rays with the same intensity along all directions from all the points of the light-emitting layer. The first bond and the second bond are assumed to be made of silicon resin with a refractive index of 1.41.

In FIG. 6, the horizontal axis represents a thickness of the submount, and the vertical axis represents light outcoupling efficiency. A curve denoted by "B1" in the diagram shows a case where the planar size of the submount is 1 mm sq. and a curve denoted by "B2" in the diagram shows a case where the planar size of the submount is 2 mm sq. From FIG. 6, it is inferred that, when the thickness of the submount is 2 mm or less, the light outcoupling efficiency decreases due to light absorption by the opaque substrate, regardless of the planar size of the submount.

Also, FIG. 6 teaches that, when the thickness of the submount is 2 mm or less, the light outcoupling efficiency is higher with a decrease in the planar size of the submount.

Figure 7:
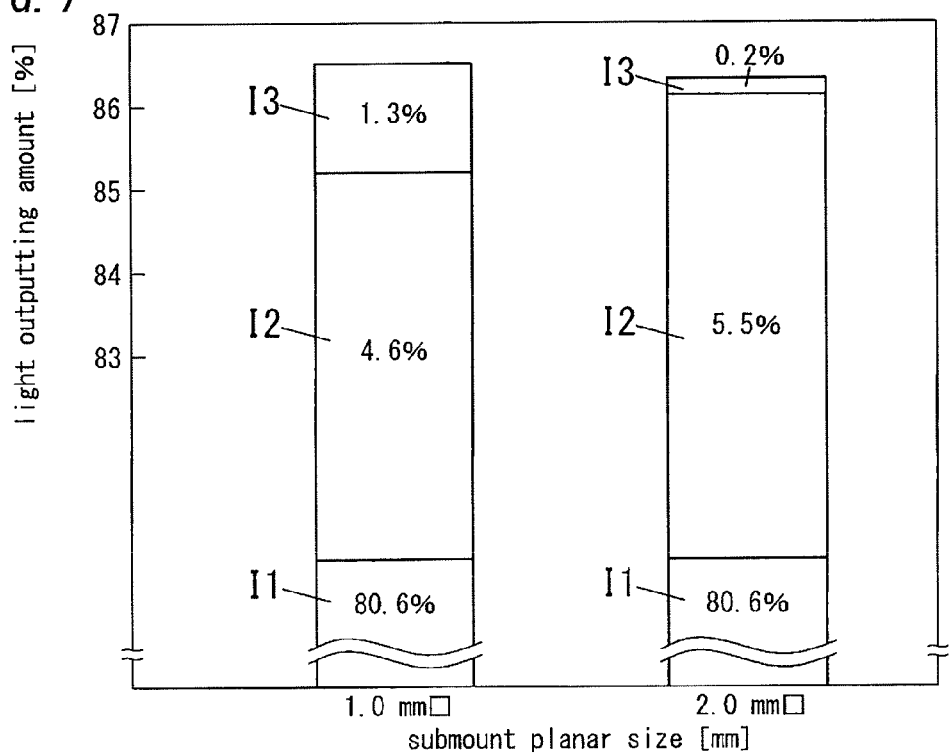
FIG. 7 is an explanatory diagram of a simulation result of the relation between a planar size of the submount and a light outputting amount of the light-emitting device of the comparative example.

Besides, the inventors simulated a ratio between light emission amounts from the faces of the LED module, regarding the LED modules of the comparative examples each including the submount constituted by the alumina substrate only. The submounts had the same thickness of 0.4 mm, and the planar sizes of 1 mm sq. and 2 mm sq., respectively. FIG. 7 shows an example of the results. This simulation is a geometric optical simulation by Monte Carlo ray tracing. Note that, in the simulation, the reflectance of the surface of the opaque substrate and the absorptance of the opaque substrate are assumed to be 95% and 5%, respectively. Also, in the simulation, the chip size of the LED chip 6 is assumed to be 0.5 mm by 0.24 mm. Also, in the simulation, only a Fresnel loss is assumed to occur at the side faces of the LED chip 6.

Reference sign "I1" in FIG. 7 denotes a ratio of the outputted light amount directly from the LED chip 6. Reference sign "I2" in FIG. 7 denotes a ratio of the outputted light amount from an exposed surface (exposed portion of the surface of the submount) of the submount at the side of the LED chip 6. Reference sign "I3" in FIG. 7 denotes a ratio of the outputted light amount from the side faces of the submount.

From the results in FIGS. 6 and 7, the inventors obtained knowledge that the smaller the planar size of the submount, the higher the ratio of the outputted light amount from the side faces of the submount, and as a result the light outcoupling efficiency can be improved.

Moreover, the inventors investigated a relation between the thickness of the submount and the light flux emitted by the LED module with respect to various opaque substrates in condition that a planar size of the submount is 2 mm sq. The light flux is measured by an integrating sphere. As the result, the inventors obtained an experimental result shown in FIG. 8. In the experiment, as the LED chip 6, adopted was a blue LED chip in which the substrate was a sapphire substrate and the emission peak wavelength from the light-emitting layer was 460 nm. The chip size of the LED chip 6 was 0.5 mm by 0.24 mm. The encapsulating portion 10 was composed of a silicone resin and a yellow fluorescent material. The white circles (○) in line C1 in FIG. 8 denote measured values of light flux with respect to a light-emitting device of Reference Model 1. In the light-emitting device of Reference Model 1, the submount was an alumina substrate, and the opaque substrate was a silver substrate having reflectance of 98% with respect to light with a wavelength of 460 nm. The white triangles (Δ) in line C2 in FIG. 8 designate measured values of light flux with respect to a light-emitting device of Reference Model 2. In the light-emitting device of Reference Model 2, the submount was an alumina substrate, and the opaque substrate was a substrate including a copper substrate and a reflection layer composed of a white mask having reflectance of 92% with respect to light with a wavelength of 460 nm on a surface of the copper substrate. The white rhombuses (◇) in line C3 in FIG. 8 designate measured values of light flux with respect to a light-emitting device of Reference Model 3. In the light-emitting device of Reference Model 3, the submount was an alumina substrate, and the opaque substrate was an aluminum substrate having reflectance of 95% with respect to light with a wavelength of 460 nm.

Figure 8:
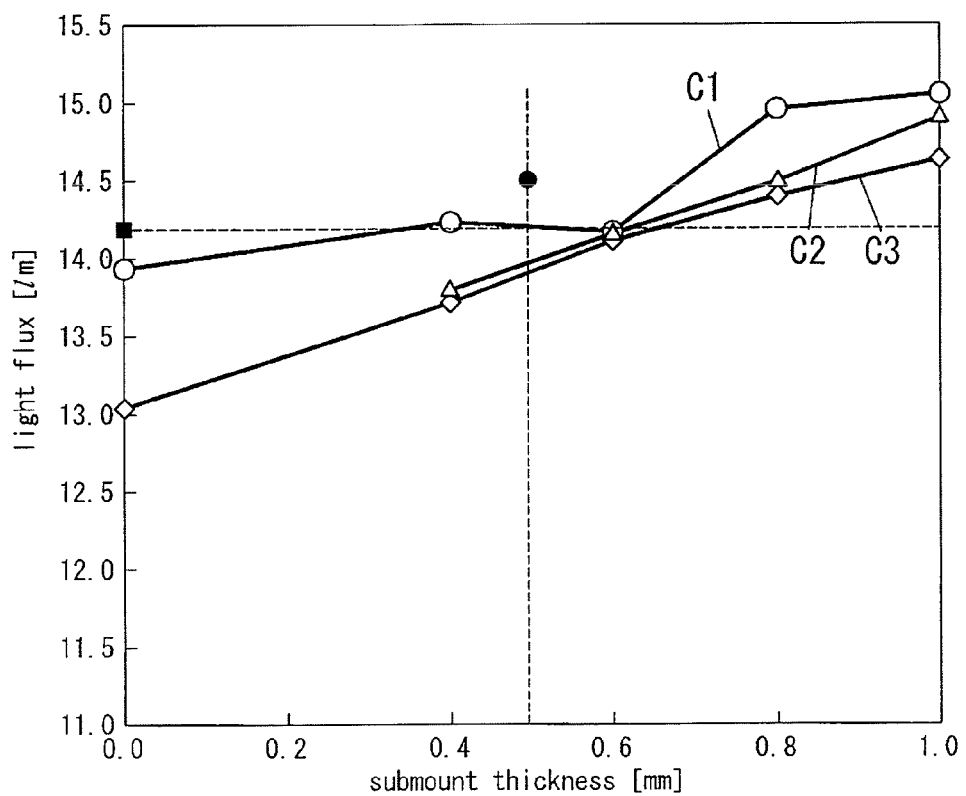
FIG. 8 is an explanatory diagram of an experimental result of the relation between a thickness of the submount and light outcoupling efficiency.

From values denoted by reference signs C1, C2, and C3 in FIG. 8, it is inferred that the light outcoupling efficiency of the light-emitting device 1 of the present embodiment can be improved by increasing the thickness of the light-transmissive member 4 which corresponds to the submount.

On the other hand, from a viewpoint of efficiently dissipating heat generated in the LED chip 6 to the second surface (further surface) 42 of the light-transmissive member 4 (that is, from a viewpoint of improving the heat dissipation property), it is preferable that the light-transmissive member 4 is thinner. In short, the light outcoupling efficiency and the heat dissipation property are in a trade-off relationship.

Moreover, the inventors fabricated a light-emitting device having a reference structure in which the submount was not provided and a high purity alumina substrate was used as the opaque substrate, and performed an experiment of measuring a light flux emitted by the light-emitting device having the reference structure. The black square (■) in FIG. 8 designates measured values of light flux with respect to the light-emitting device having the reference structure. The inventors obtained an experimental result that, the light-emitting device of aforementioned Reference Model 1 is required to include the submount having the thickness of 0.4 mm or more to emit a greater light flux than the light-emitting device having the reference structure. Therefore, the inventors considered that it is preferable to adjust the thickness of the submount to an approximate range of 0.4 mm to 0.5 mm, in view of the light outcoupling efficiency and the heat dissipation property. Note that, with regard to the alumina substrate used in the light-emitting device having the reference structure, the thickness of the alumina substrate is 1 mm, the particle diameter of particles constituting the alumina substrate is 1 μm, and the reflectance of the alumina substrate is 91%.

In the light-emitting device of Reference Model 1 in which the silver substrate was used as the opaque substrate, there is concern that the reflectance may decrease due to sulfurization of the silver substrate. In the light-emitting device of Reference Model 2 in which the reflection layer composed of the white mask is used, there is concern that the reflectance may decrease due to thermal degradation of the white mask.

Hence, in the light-emitting device 1 of the present embodiment, the light-transmissive member 4 has a configuration in which the second ceramic layer 4a and the first ceramic layer 4b are stacked in the thickness direction.

The inventors performed an experiment of measuring light flux emitted by Reference Model 4. Reference Model 4 includes the light-transmissive member 4 instead of the submount of the light-emitting device of Reference Model 2. In Reference Model 4, the light-transmissive member 4 had the thickness (refer to FIG. 3) of 0.5 mm, the second ceramic layer 4a had the thickness Hsa (refer to FIG. 3) of 0.1 mm and the reflectance of 96% to light with a wavelength of 450 nm, and the first ceramic layer 4b had the thickness Hsb (refer to FIG. 3) of 0.4 mm and the reflectance of 80% to light with a wavelength of 450 nm. The black circle (●) in FIG. 8 designates a measured value of light flux with respect to Reference Model 4. FIG. 8 teaches that the light-emitting device 1 of Reference Model 4 emits a greater light flux than the light-emitting device having the reference structure. Also, from FIG. 8, it is speculated that the light-emitting device 1 of Reference Example 1 emits a greater light flux than those of Reference Models 1, 2, and 3 in which the submount has the thickness of 0.5 mm. Note that according to measurement using a spectrophotometer and an integrating sphere, the light-transmissive member 4 of the light-emitting device of Reference Model 4 has absorptance of approximately 0% to light with a wavelength of 450 nm. According to measurement using a spectrophotometer and an integrating sphere, the light-transmissive member 4 of the light-emitting device of Reference Model 4 has reflectance of approximately 94% to the light with a wavelength of 450 nm. According to measurement using a spectrophotometer and an integrating sphere, the single layer of the alumina substrate with a thickness of 0.4 mm used in Reference Models 1, 2, and 3 has reflectance of approximately 89% to the light with a wavelength of 450 nm.

Figure 9:
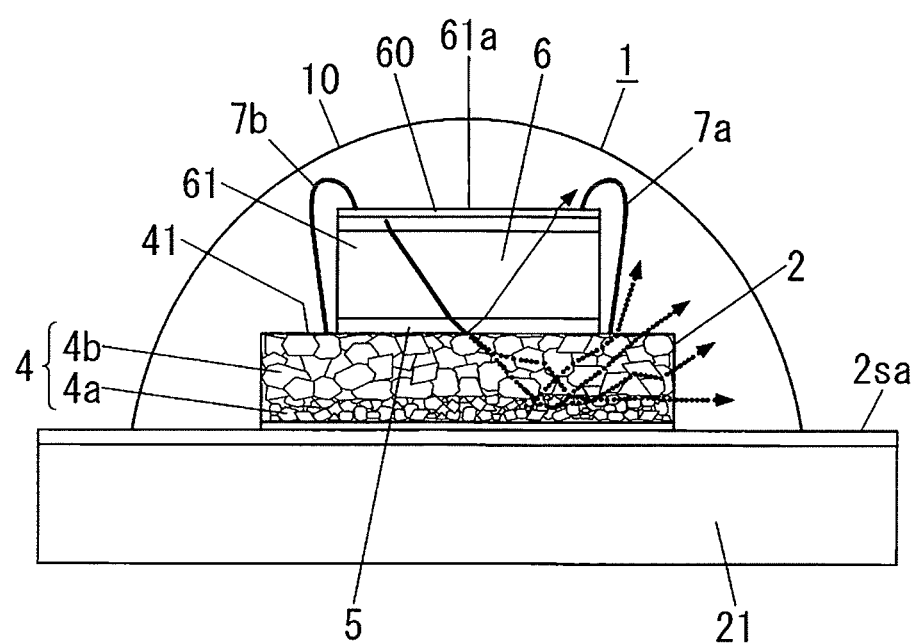
FIG. 9 is an inferred mechanism diagram for illustrating the principle relating to improvement of light outcoupling efficiency in an LED module including the light-emitting device of Embodiment 1.

Incidentally, the reason why the light outcoupling efficiency of the light-emitting device 1 is improved will be described with reference to the inferred mechanism diagrams in FIGS. 9, 10A, 10B, and 10C. Note that the light-emitting device 1 is in the scope of the present invention, even if the inferred mechanism is different from the mechanism described below. In FIG. 9, the light-emitting device 1 is provided on a surface 2sa of a wiring substrate 21 described below, but may not be provided on the wiring substrate 21.

Figure 10A:
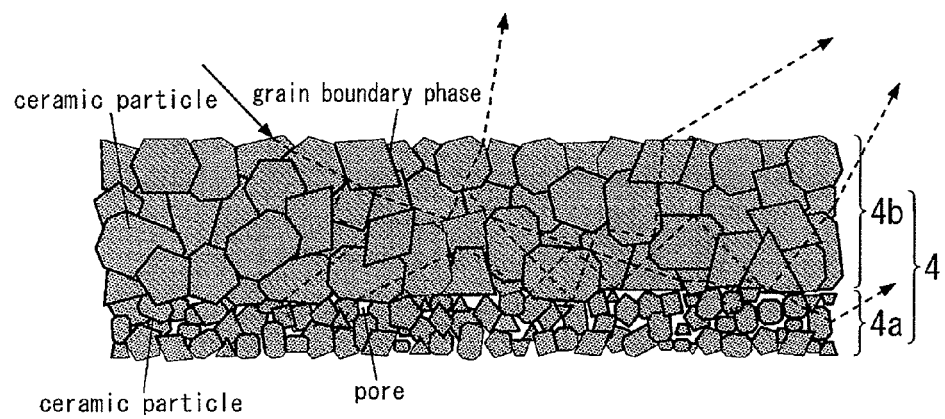
FIGS. 10A to 10C are inferred mechanism diagrams for illustrating the principle relating to improvement of light outcoupling efficiency in the LED module including the light-emitting device of Embodiment 1.
Figure 10B:
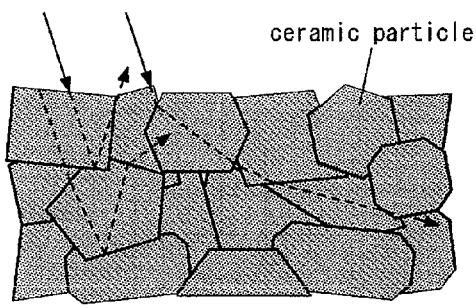

Arrows shown in FIGS. 9, 10A, 10B, and 10C schematically illustrate propagating paths of rays of light which are emitted from the light-emitting layer of the LED structure portion 60 in the LED chip 6. Solid-line arrows in FIGS. 9, 10A, and 10B schematically illustrate propagating paths of rays of light which are emitted from the light-emitting layer and are reflected by the first surface 41 of the light-transmissive member 4. Broken-line arrows in FIGS. 19, 10A, 10B, and 10C schematically illustrate propagating paths of rays of light which are emitted from the light-emitting layer of the LED structure portion 60 and enter the light-transmissive member 4.

Figure 10C:
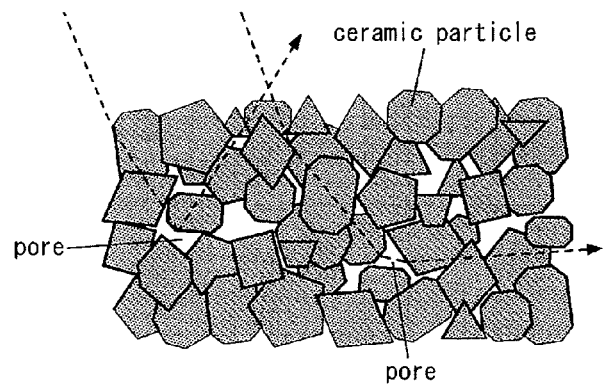

The inventors inferred that, as shown in FIGS. 9, 10A, and 10B, reflection and refraction occur in the first ceramic layer 4b at the interface between the ceramic particles and the grain boundary phase (glass component is the main component therein) caused by a difference between the refractive indices of the ceramic particle and the grain boundary phase. Also, the inventors inferred that, as shown in FIGS. 9 and 10C, reflection and refraction occur in the second ceramic layer 4a at the interface between the ceramic particle and the pore and/or the grain boundary phase (glass component is the main component) caused by a difference between the refractive indices of the ceramic particle and the pore and/or the grain boundary phase. Also, the inventors inferred that, as shown in FIGS. 9 and 10C, reflection and refraction occur in the second ceramic layer 4a at the interface between the pore and the grain boundary phase caused by a difference between the refractive indices of the pore and the grain boundary phase. Also, the inventors inferred that, with respect to a ceramic plate, when the plate thickness is the same, the larger the particle diameter of the ceramic particles in the plate, the smaller the reflectance and the larger the transmittance, since the larger the particle diameter of the ceramic particles, the smaller the number of interfaces, and the probability that light passes through the interface between the ceramic particles and the grain boundary phase is reduced when light propagates a unit length.

The inventors inferred that light outcoupling efficiency of the light-emitting device 1 can be improved by causing light emitted from the LED chip 6 to pass through the first ceramic layer 4b as much as possible, and causing the light to be reflected in the second ceramic layer 4a as much as possible. Therefore, it is preferable that, in the light-transmissive member 4, the first ceramic layer 4b includes ceramic particles having a greater particle diameter than that of ceramic particles of the second ceramic layer 4a, namely, the second ceramic layer 4a includes ceramic particles having a smaller particle diameter than that of the ceramic particles of the first ceramic layer 4b, and the second ceramic layer 4a further includes pores.

The first ceramic layer 4b is a first dense layer 4b composed of ceramics sintered at a high temperature in a range of around 1500° C. to 1600° C. The first ceramic layer 4b has good rigidity compared with the second ceramic layer 4a, since ceramic particles are bound strongly to each other by the high temperature sintering. Here, the good rigidity indicates that a flexural strength is relatively high. As a material of the first ceramic layer 4b, alumina is preferable.

The second ceramic layer 4a is composed of ceramics sintered at 1000° C. or less (850° C. to 1000° C., for example) which is a relatively low temperature compared with the sintering temperature of the first ceramic layer 4b. The ceramics constituting the second ceramic layer 4a may be, for example, a second dense layer 4a which contains a ceramic filler (ceramic microparticles) and a glass component, or a porous layer 4a containing a ceramic filler (ceramic microparticles) and a glass component.

In brief, in Embodiment 1, the second light-transmissive layer (the second ceramic layer) 4a is formed by sintering at lower temperature than a temperature of sintering for the first light-transmissive layer (the first ceramic layer) 4b. Specifically, the first light-transmissive layer 4b is formed by sintering at a temperature ranging from 1500° C. to 1600° C. while the second light-transmissive layer 4a is formed by sintering at a temperature ranging from 850° C. to 1000° C.

The second dense layer 4a is composed of dense ceramics in which ceramic fillers are bound each other by sintering and glass components are arranged around the ceramic fillers as a matrix. In the second dense layer, the ceramic filler mainly performs a function of reflecting light. The second dense layer may be made of borosilicate glass, glass ceramics which contains lead borosilicate glass and alumina, a material in which a ceramic filler is mixed with glass ceramics which contains soda-lime glass and alumina, or the like. The glass content of the glass ceramics is preferably set in a range of around 35 to 60 wt %. The ceramics content of the glass ceramics is preferably set in a range of around 40 to 60 wt %. Note that, in the second dense layer, the zinc component of the lead borosilicate glass can be substituted for titanium oxide or tantalum oxide to increase refractive index of the glass ceramics. The ceramic filler is preferably made of a material having higher refractive index than glass ceramics, and may be, for example, tantalum pentoxide, niobium pentoxide, titanium oxide, barium oxide, barium sulfate, magnesium oxide, calcium oxide, strontium oxide, zinc oxide, zirconium oxide, or silicate oxide (zircon).

Figure 11:
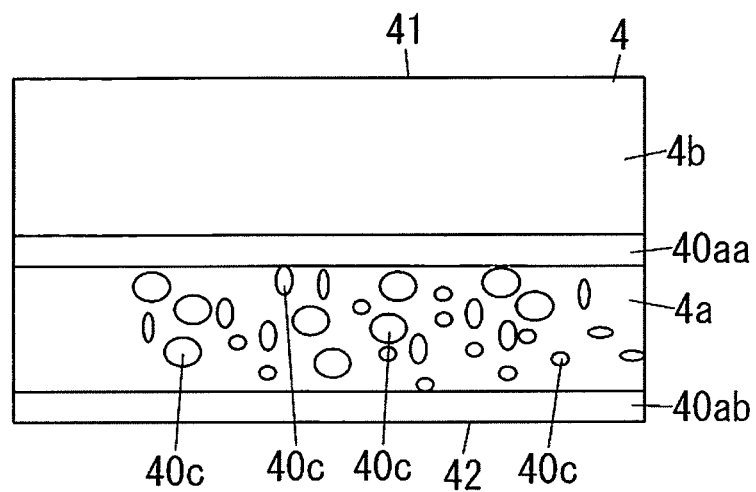
FIG. 11 is a schematic explanatory diagram of a light-transmissive member in the light-emitting device of Embodiment 1.

When the second ceramic layer 4a is constituted by a porous layer (hereinafter, "second ceramic layer 4a" is also referred to as "porous layer 4a"), it is preferable that a first glass layer 40aa is interposed between a porous layer 4a having a plurality of pores 40c and the first ceramic layer 4b, and a second glass layer 40ab is formed on an opposite side of the porous layer 4a from the first ceramic layer 4b, as shown in the schematic diagram in FIG. 11.

In this regard, the porous layer 4a is higher in reflectance than the first light-transmissive layer 4b. Besides, the glass layers 40aa and 40ab do not diffuse light at an interface between the layers and do not diffuse light within the layers per se. Therefore, the first glass layer 40aa and the second glass layer 40ab do not correspond to the light-transmissive layers of the present embodiment. That is, in FIG. 11, the porous layer 4a is defined as the second light-transmissive layer 4a.

The porosity of the porous layer 4a is set to be around 40%, but is not limited thereto. The first glass layer 40aa and the second glass layer 40ab are transparent layers composed of a glass component and transmit visible light. The thicknesses of the first glass layer 40aa and the second glass layer 40ab may be set to around 10 μm, for example, but are not limited thereto. Around half of the glass component of each of the first glass layer 40aa and the second glass layer 40ab is composed of $SiO_2$, but the glass component is not limited thereto.

The first glass layer 40aa is provided so as to be interposed between the porous layer 4a and the first ceramic layer 4b, and is closely-attached to the surface of the porous layer 4a and to the surface of the first ceramic layer 4b by sintering at the time of manufacture.

The second glass layer 40ab is provided on the opposite face of the porous layer 4a from the first ceramic layer 4b, and protects the porous layer 4a. Accordingly, pores 40c that exist on the opposite surface of the porous layer 4a from the first ceramic layer 4b is enclosed by the second glass layer 40ab.

The porous layer 4a contains a ceramic filler (ceramic particulate) and a glass component. In the porous layer 4a, the ceramic fillers are combined to form clusters by sintering so as to form a porous structure. The glass component serves as a binder for the ceramic filler. In the porous layer 4a, the ceramic filler and the plurality of pores mainly perform a function of reflecting light. Note that, the porous layer 4a can be formed in accordance with a manufacturing process of a package disclosed in paragraphs [0023]-[0026] and in FIG. 4 in WO2012/039442 A1.

Figure 12:
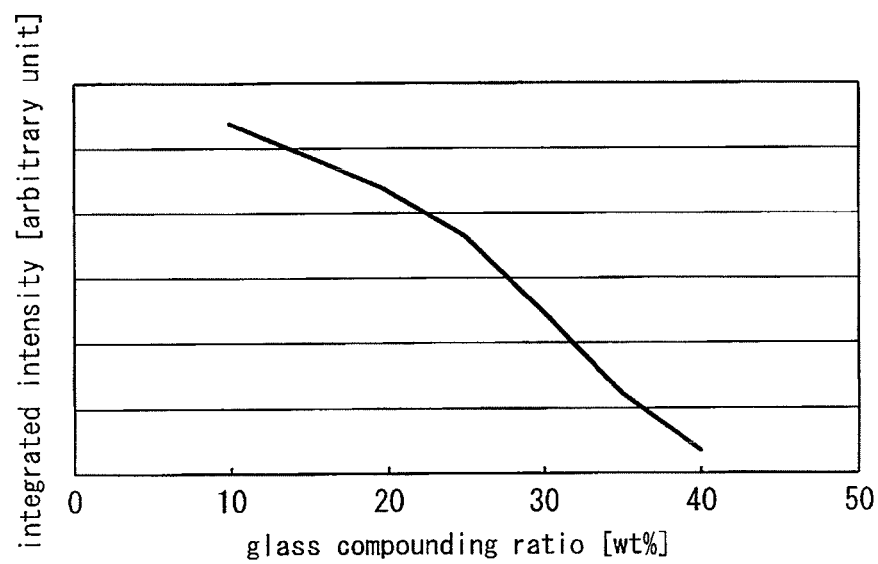
FIG. 12 is an explanatory diagram of the relation between a glass compounding ratio of the light-transmissive member in the light-emitting device of Embodiment 1 and integrated intensity of an integrating sphere.

The reflectance of the porous layer 4a can be changed by, for example, changing a weight ratio between the glass component and the ceramic component (such as alumina and zirconia). That is, the reflectance of the porous layer 4a can be changed by changing the glass compounding ratio. In FIG. 12, the horizontal axis indicates a glass compounding ratio, and the vertical axis indicates an integrated intensity measured with an integrating sphere. In measurement with the integrating sphere, intensities of reflected light with wavelengths between 380 to 780 nm are integrated. FIG. 12 teaches that the reflectance can be increased with a decrease in the glass compounding ratio.

Figure 13:
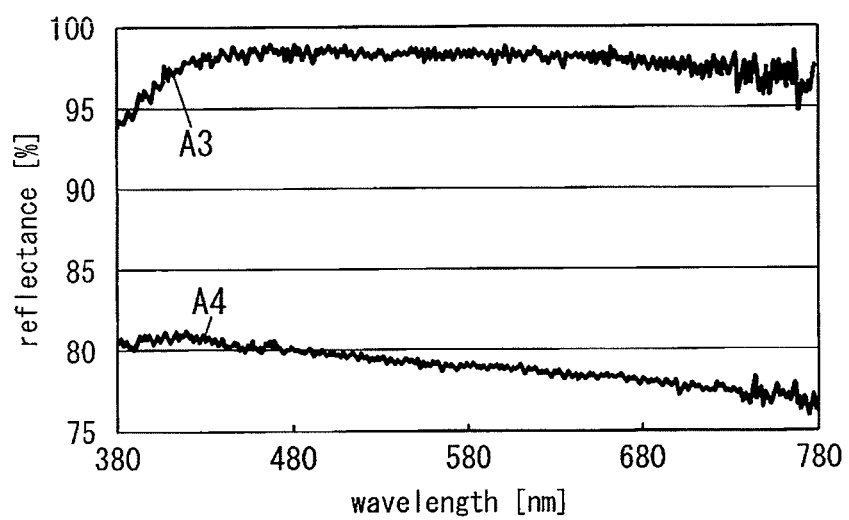
FIG. 13 is a reflectance-wavelength characteristic diagram of the light-transmissive member in the light-emitting device of Embodiment 1 and an alumina substrate.

Accordingly, in Example, the first ceramic layer 4b is formed by sintering alumina at 1600° C., and the porous layer 4a is formed by sintering materials at 850° C., the materials being compounded such that the weight ratio of the glass component to the ceramic component is 20:80. In Example, the glass component is borosilicate glass with a median diameter of around 3 μm, and the alumina is a compound of alumina with a median diameter of around 0.5 μm and alumina with a median diameter of around 2 μm, and the zirconia has a median diameter of around 0.2 μm. In Example, the first ceramic layer 4b has the thickness of 0.38 mm, and the porous layer 4a has the thickness of 0.10 mm. The reflectance-wavelength characteristics of the light-transmissive member 4 in Example is indicated by a curve designated by "A3" in FIG. 13, and the reflectance-wavelength characteristics of the single layer alumina substrate with a thickness of 0.38 mm is as shown by a curve designated by "A4" in FIG. 13. Note that, the weight ratio of the glass component to the ceramic component in the porous layer 4a and the particle diameters (median diameters) of the respective materials are not particularly limited.

The porous layer 4a has a graded composition in which the density of the glass component gradually decreases from the both sides thereof to the inside in the thickness direction, since the glass components of the first glass layer 40aa and the second glass layer 40ab infiltrate at the time of manufacture.

Specifically, as the result of observing a cross-section along the thickness direction of the porous layer 4a with a thickness of around 100 μm with a microscope, it was found out that in regions from respective faces of the porous layer 4a to the depth of around 20 μm in the thickness direction, glass dense layers exist in which glass occupies 70% or more of the area per unit area. In contrast to this, in the internal region deeper than 20 μm from respective faces of the porous layer 4a in the thickness direction, glass occupies around 20% of the area per unit area, and a non-dense layer exists in which the glass and the ceramic filler are mixed at a certain ratio.

Moreover, the inventors performed an experiment to measure light flux and chromaticity of light emitted from the light-emitting device 1. In the experiment, the measurement was made for each of the different particle diameters (median diameter) of the alumina particle in the first ceramic layer 4b. In the experiment, the LED chip 6 was a blue LED chip in which the substrate was a sapphire substrate and the emission peak wavelength from the light-emitting layer was 460 nm. The chip size of the LED chip 6 was 0.5 mm by 0.24 mm. The thickness and the planar size of the submount 4 were 0.49 mm and 2 mm sq. (2 mm by 2 mm), respectively.

The chromaticity is a psychophysical property of color that is determined by chromaticity coordinates in an xy chromaticity diagram of a CIE color system. The chromaticity was measured in a direction in which the radiation angle of light emitted from the light-emitting device 1 is 0° (light axis direction), and in a direction in which the radiation angle is 60° (direction in which the angle relative to the light axis is 60°). In the measurement of the chromaticity, a spectral distribution in each of the radiation angles was obtained by a spectrophotometer, and the chromaticity in the CIE color system was calculated from each of the spectral distribution.

Figure 14:
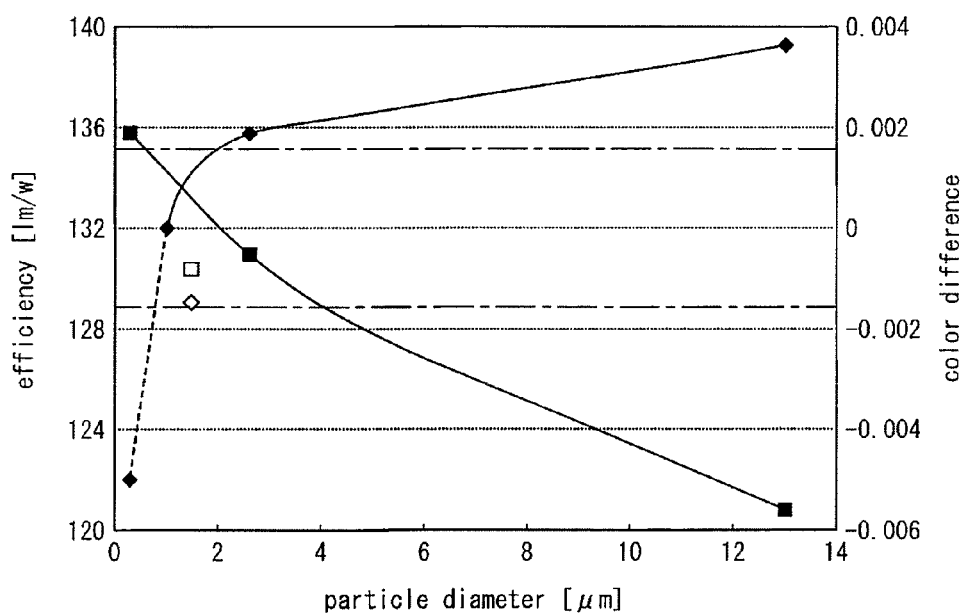
FIG. 14 is an explanatory diagram of an experimental result of the relation between a particle diameter of an alumina particle in a first light-transmissive layer and efficiency and color difference.

The experimental results are summarized in FIG. 14. The horizontal axis in FIG. 14 indicates a particle diameter. The left vertical axis in FIG. 14 indicates efficiency calculated by a light flux and input power supplied to the light-emitting device 1. The right vertical axis in FIG. 14 indicates a color difference. The color difference is defined as the value of x (hereinafter referred to as "$x_1$") in the direction in which the radiation angle is 60° in the chromaticity coordinates, when a value of x (hereinafter referred to as "$x_0$") in the direction in which the radiation angle is 0° in the chromaticity coordinates is set as a reference. That is, the color difference in the right vertical axis in FIG. 14 is a value of ($x_1-x_0$). When the value of ($x_1-x_0$) is positive, it means that the larger the absolute value thereof, the larger the shift of the chromaticity to the yellowish-white side. When the value of ($x_1-x_0$) is negative, it means that the larger the absolute value thereof, the larger the shift of the chromaticity to the blue-white side. Note that the design value of the chromaticity in the light-emitting device 1 is (0.33, 0.33). That is, the design value of x in the chromaticity coordinates is 0.33. The design value of the chromaticity is an example, and is not limited thereto.

The black rhombuses (◆) in FIG. 14 designate measured values of the efficiency of the light-emitting device 1. The black squares (■) in FIG. 14 designate measured values of the color difference of the light-emitting device 1. The white rhombus (◇) in FIG. 14 designates a measured value of the efficiency of the aforementioned light-emitting device having the reference structure. The white square (□) in FIG. 14 designates a measured value of the color difference of the aforementioned light-emitting device having the reference structure. Note that, since the light-emitting device having the reference structure does not include the submount 4, the particle diameter in the horizontal axis in FIG. 14 shows a particle diameter of particles in the alumina substrate.

The allowable range of the color difference in the light-emitting device 1 is preferably in a range between −0.0015 to 0.0015, for example, from a viewpoint of suppressing color unevenness and a viewpoint of realizing a color difference equivalent or less to the color difference of the light-emitting device having the reference structure.

FIG. 14 teaches that the light-emitting device 1 has higher efficiency than the light-emitting device having the reference structure. Also, from FIG. 14, it is inferred that the efficiency of the light-emitting device 1 can be increased compared with that of the light-emitting device having the reference structure by setting the particle diameter in a range between 1 μm to 4 μm, while suppressing the color difference from exceeding the allowable range (in other words, becoming larger than the color difference of the light-emitting device having the reference structure).

In the light-emitting device 1 of the present embodiment, the light-transmissive member 4 is constituted by the two light-transmissive layers (ceramic layers) 4a and 4b, and optical properties of the ceramic layers 4a and 4b differ from each other, and the ceramic layer 4a which is further from the LED chip 6 has a higher reflectance with respect to light emitted from the LED chip 6 than the ceramic layer 4b that is closer to the LED chip 6. Accordingly, light outcoupling efficiency of the light-emitting device 1 of the present embodiment can be improved compared with that of a LED module including the light-transmissive member 4 which is constituted by only a single layer alumina substrate. In the light-emitting device 1 of the present embodiment, it is possible to reduce an amount of light reflected from the surface of the light-transmissive member 4, and as a result, absorption loss in the LED chip 6 can be reduced. Furthermore, in the light-emitting device 1 of the present embodiment, absorptance of light (approximately 0%) of the light-transmissive member 4 can be smaller than the absorptance of light (around 2 to 8%, for example) of the opaque substrate, and parts of light, which enters the light-transmissive member 4 from the surface can be scattered in the ceramic layer 4b and can be reflected at the interface between the ceramic layer 4b and the ceramic layer 4a. Consequently, in the light-emitting device 1, it is possible to reduce an amount of light which passes through the light-transmissive member 4 and emerge from the further surface of the light-transmissive member 4 and absorption loss at the first external electrode 8a, the second external electrode 8b, and the circuit substrate. As a result, light outcoupling efficiency can be improved.

Incidentally, in the light-emitting device 1 of the present embodiment, the first ceramic layer 4b has relatively higher light transmittance, and the second ceramic layer 4a has relatively higher light scattering rate, out of the first ceramic layer 4b and the second ceramic layer 4a. Accordingly, it is inferred that, in the light-emitting device 1, light can be diffused in the second ceramic layer 4a that is farther from the LED chip 6, and an amount of light that is diffused before arriving at the circuit substrate increases compared with a LED module having only the first ceramic layer 4b. Also, it is speculated that, in the light-emitting device 1, the possibility that light reflected by the circuit substrate directly below the submount 4 is diffused without returning to the LED chip 6 can be increased. In contrast, it is speculated that, in the light-emitting device 1, when the light-transmissive member 4 is constituted by only the second ceramic layer 4a, the possibility that light is scattered in the vicinity of the LED chip 6 and then returns to the LED chip 6 may be increased, unfortunately, because the possibility that light emitted from the LED chip 6 toward the light-transmissive member 4 is scattered in a vicinity of the LED chip 6 may be increased. Consequently, it is speculated that, in the light-emitting device 1, it is possible to reduce an amount of light returning to the LED chip 6, compared with a light-emitting device including the light-transmissive member 4 constituted by only the second ceramic layer 4a. Moreover, in the light-emitting device 1, it is possible to reduce the thickness of the light-transmissive member 4 required to obtain the same reflectance, compared with the light-transmissive member 4 constituted by only the first ceramic layer 4b.

Figure 15:
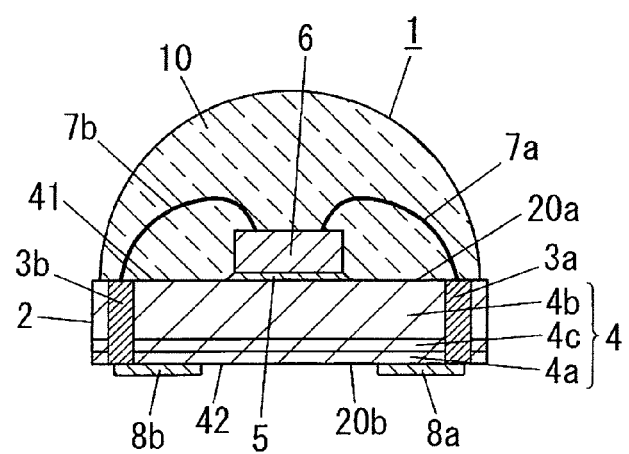
FIG. 15 is a schematic cross-section illustrating a modification of the light-emitting device of Embodiment 1.

Note that, in the present embodiment, the light-transmissive member 4 includes two light-transmissive layers 4a and 4b. However, the light-transmissive member 4 may include three or more light-transmissive layers. FIG. 15 shows a modification of Embodiment 1. In the modification shown in FIG. 15, the light-transmissive member 4 includes three light-transmissive layers (the first light-transmissive layer 4b, the second light-transmissive layer 4a, and a third light-transmissive layer 4c). The light-transmissive layers 4a, 4b, and 4c are arranged in an order of the light-transmissive layers 4b, 4c, and 4a from the LED chip 6 and are stacked in the thickness direction of the light-transmissive member 4. The reflectance of the third light-transmissive layer 4c is greater than the reflectance of the first light-transmissive layer 4b but is smaller than the reflectance of the second light-transmissive layer 4a. That is, in the light-transmissive member 4, the light-transmissive layers 4a, 4b, and 4c satisfy a relation in reflectance of: the reflectance of the first light-transmissive layer 4b<the reflectance of the third light-transmissive layer 4c<the reflectance of the second light-transmissive layer 4a.

Besides, the light-emitting device 1 of Embodiment 1 includes one LED chip 6 on one mounting substrate 2. However, the light-emitting device 1 may include a plurality of LED chips 6 on one mounting substrate 2 as described below (see, Embodiment 2).

In summary, the light-emitting device 1 of Embodiment 1 includes: a mounting substrate 2 having a surface 20a; an LED chip 6 bonded to the surface 20a with a bond; and an encapsulating portion 10 covering the LED chip 6 on the surface 20a of the mounting substrate 2. The mounting substrate 2 including: a light-transmissive member 4 having a planar size larger than a planar size of the LED chip 6; a first penetrating wiring 3a which penetrates the light transmissive member 4 in a thickness direction of the light transmissive member 4 and is electrically connected to a first electrode of the LED chip 6 via a first wire 7a; and a second penetrating wiring 3b which penetrates the light transmissive member 4 in the thickness direction and is electrically connected to a second electrode of the LED chip 6 via a second wire 7b. The encapsulating portion 10 covers the LED chip 6, the first wire 7a, and the second wire 7b. The bond allows light emitted from the LED chip 6 to pass therethrough. The light-transmissive member 4 is constituted by at least two light-transmissive layers which are stacked in the thickness direction. The at least two light-transmissive layers have different optical properties. A light-transmissive layer of the at least two light-transmissive layers which is farther from the LED chip 6 is higher in reflectance to light emitted from the LED chip 6. In this regard, the light-transmissive member 4 propagates incident light to the outside through refraction or internal diffusion (scattering).

In this light-emitting device 1, the encapsulating portion 10 is preferably contains a transparent material and a wavelength conversion material, which is a fluorescent material excited by the light emitted from the LED chip 6 to emit light having a different color from a color of the light emitted from the LED chip 6.

In other words, the light-emitting device 1 of Embodiment 1 has a following first feature.

In the first feature, the light-emitting device 1 includes a mounting substrate 2, an LED chip 6, and an encapsulating portion 10. The LED chip 6 is bonded to a surface 20a with a bond 5. The encapsulating portion 10 covers the LED chip 6 on the surface 20a of the mounting substrate 2. The bond 5 allows light emitted from the LED chip 6 to pass therethrough. The mounting substrate 2 including: a light-transmissive member 4 having a planar size larger than a planar size of the LED chip 6; a first penetrating wiring 3a; and a second penetrating wiring 3b. The first penetrating wiring 3a penetrates the light transmissive member 4 in a thickness direction of the light transmissive member 4 and is electrically connected to a first electrode of the LED chip 6 via a first wire 7a. The second penetrating wiring 3b penetrates the light transmissive member 4 in the thickness direction and is electrically connected to a second electrode of the LED chip 6 via a second wire 7b. The encapsulating portion 10 covers the first wire 7a and the second wire 7b. The light-transmissive member 4 is constituted by at least two light-transmissive layers which are stacked in the thickness direction. The at least two light-transmissive layers have different optical properties. A light-transmissive layer of the at least two light-transmissive layers which is farther from the LED chip 6 is higher in reflectance to light emitted from the LED chip 6.

Besides, the light-emitting device 1 of Embodiment 1 may optionally have the following second to ninth feature in addition to the first feature.

In the second feature referring to the first feature, the light-transmissive member 4 allows light that is emitted from the LED chip 6 and enters the light-transmissive member 4 to be diffusely reflected at an interface between the at least two light-transmissive layers.

In the third feature referring to the first or second feature, the light-transmissive member 4 includes a first light-transmissive layer 4b and a second light-transmissive layer 4a of the at least two light-transmissive layers, the second light-transmissive layer 4a being farther from the LED chip 6 than the first light-transmissive layer 4b is, and the light-transmissive member 4 allows light to be diffused at the second light-transmissive layer 4a.

In the fourth feature referring to any one of the first to third features, the light-transmissive member 4 includes a first light-transmissive layer 4b and a second light-transmissive layer 4a of the at least two light-transmissive layers, the second light-transmissive layer 4a being farther from the LED chip 6 than the first light-transmissive layer 4b is, the first light-transmissive layer 4b has a higher light transmittance than the second light-transmissive layer 4a, and the second light-transmissive layer 4a has a higher light scattering rate than the first light-transmissive layer 4b.

In the fifth feature referring to any one of the first to fourth features, the light-transmissive member 4 includes a first light-transmissive layer 4b and a second light-transmissive layer 4a of the at least two light-transmissive layers, the second light-transmissive layer 4a being farther from the LED chip 6 than the first light-transmissive layer 4b is, and the first light-transmissive layer 4b is thicker than the second light-transmissive layer 4a.

In the sixth feature referring to any one of the first to fifth features, each of the at least two light-transmissive layers is a ceramic layer.

In the seventh feature referring to the sixth feature, the light-transmissive member 4 includes a first light-transmissive layer 4b and a second light-transmissive layer 4a of the at least two light-transmissive layers, the second light-transmissive layer 4a being farther from the LED chip 6 than the first light-transmissive layer 4b is, and the second light-transmissive layer 4a is formed by sintering at a lower temperature than a temperature for sintering of the first light-transmissive layer 4b.

In the eighth feature referring to the seventh feature, the first light-transmissive layer 4b is formed by sintering at a temperature of 1500° C. or more but 1600° C. or less, and the second light-transmissive layer 4a is formed by sintering at a temperature of 850° C. or more but 1000° C. or less.

In the ninth feature referring to any one of the first to eighth features, the encapsulating portion 10 contains a transparent material and a wavelength conversion material, and the wavelength conversion material is a fluorescent material which is excited by the light emitted from the LED chip 6 to emit light having a different color from a color of the light emitted from the LED chip 6.

The light-emitting device 1 in accordance with the present invention can have improved light outcoupling efficiency.

Figure 16:
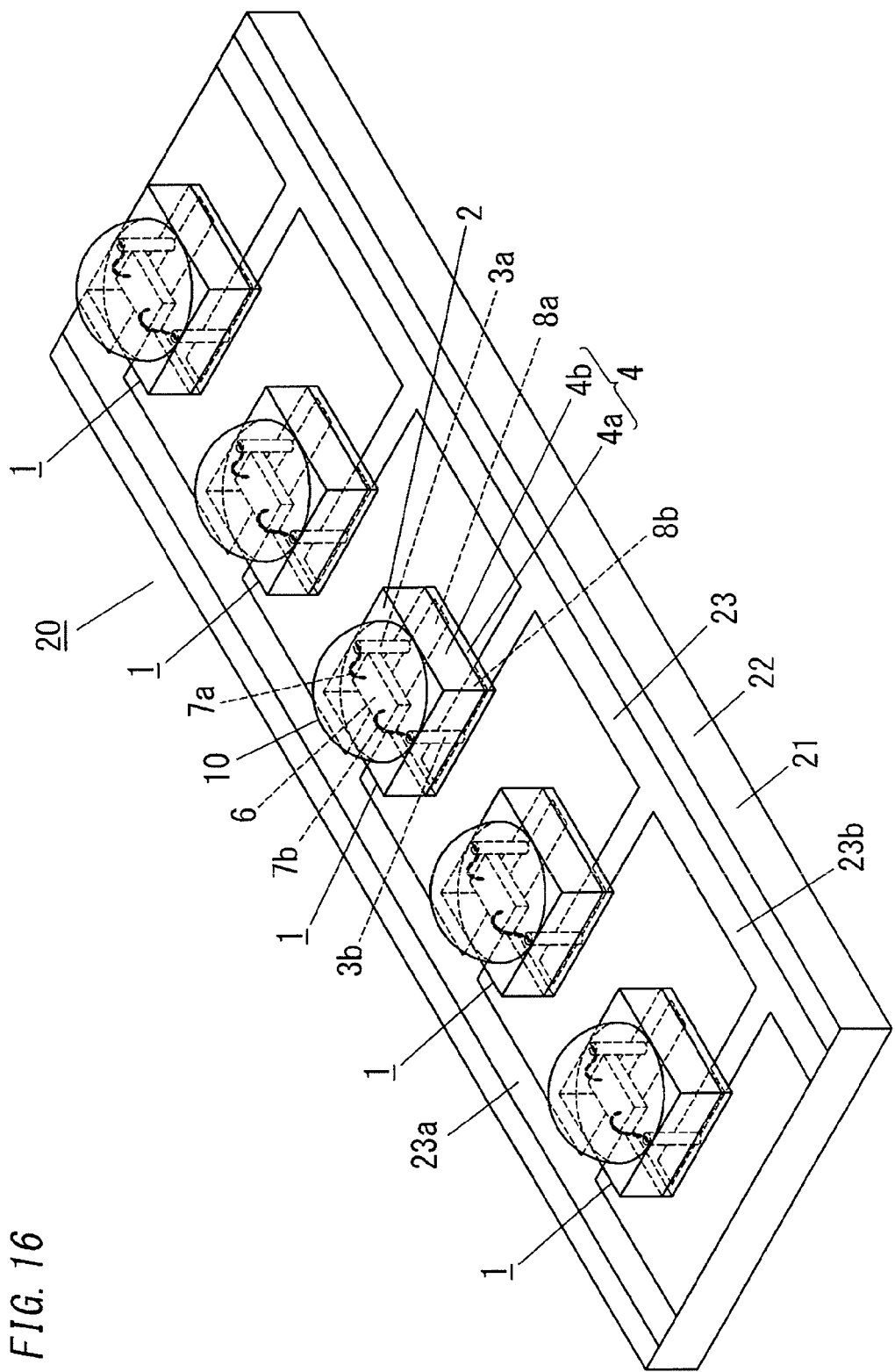
FIG. 16 is a schematic perspective view of an LED module including the light-emitting devices of Embodiment 1.

FIG. 16 shows an example of an LED module 20 including the light-emitting devices 1 of the present Embodiment. The LED module 20 includes the light-emitting devices 1 and a wiring substrate 21 serving as a circuit substrate on which the light-emitting devices 1 are mounted. The wiring substrate 21 includes a substrate 22 and a circuit 23 provided on a surface of the substrate 22. In the LED module 20, the wiring substrate 21 has an elongated shape, and the light-emitting devices are arranged along a longitudinal direction of the wiring substrate 21. In brief, the LED module 20 shown in FIG. 16 includes the light-emitting devices 1 on the wiring substrate 21. Each of the light-emitting devices 1 includes one LED chip 6 on one mounting substrate 2.

The circuit 23 has a first circuit portion 23a to be bonded and electrically connected to the first external electrodes 8a of the light-emitting devices 1, and a second circuit portion 23b to be bonded and electrically connected to the second external electrodes 8b of the light-emitting devices 1. The first circuit portion 23a and the second circuit portion 23b have a comb shape, but the shapes thereof are not particularly limited.

Embodiment 2

Hereinafter, a light-emitting device 1 of the present embodiment will be described with reference to FIGS. 17 and 18.

The light-emitting device 1 of the present embodiment differs from the light-emitting device 1 of Embodiment 1 in that a light-transmissive member 4 has an elongated shape and a plurality of LED chips 6 are included. Note that, constituent elements similar to those in Embodiment are provided with the same reference numerals, and redundant description thereof will be omitted.

In the light-emitting device 1, the plurality of LED chips 6 are aligned in a prescribed direction (in the horizontal direction in FIG. 17B) on a surface 20a of a mounting substrate 2. In the light-emitting device 1, the LED chips 6 aligned in the prescribed direction and wires 7a and 7b connected to the respective LED chips 6 are covered by an encapsulating portion 10 having a band shape. The encapsulating portion 10 has recessed portions 10b to suppress total reflection of light emitted from each of the LED chips 6 between adjacent LED chips 6 to each other in the prescribed direction.

In the light-emitting device 1, first external electrodes 8a are electrically connected to each other via a first conductor (first shaft) 8aa with an elongated shape on a further surface (second surface) 20b of the mounting substrate 2, and second external electrodes 8b are electrically connected to each other via a second conductor (second shaft) 8ba with an elongated shape on the further surface (second surface) 20b of the mounting substrate 2. In this regard, in the light-emitting device 1, the first external electrodes 8a and the first conductor 8aa constitute a first patterned wiring 8ab, and as a result, the first patterned wiring 8ab has a comb shape. Besides, the second external electrodes 8b and the second conductor 8ba constitute a second patterned wiring 8bb, and as a result, the second patterned wiring 8bb has a comb shape.

The first patterned wiring 8ab and the second patterned wiring 8bb are arranged so as to interdigitate in the lateral direction of the mounting substrate 2. In this regard, in the light-emitting device 1, the first conductor 8aa faces the second conductor 8ba. In the light-emitting device 1, the first external electrode 8a and the second external electrode 8b are arranged alternately in the longitudinal direction of the mounting substrate 2 and separated by a space.

In the light-emitting device 1, the plurality of (nine in an example shown in the diagram) LED chips 6 are arranged in the longitudinal direction (namely, the prescribed direction) of the mounting substrate 2 and are connected in parallel. In the light-emitting device 1, power can be supplied to a parallel circuit in which the plurality of LED chips 6 are connected in parallel. In short, in the light-emitting device 1, power can be supplied to all the LED chips 6 by applying voltage between the first patterned wiring 8ab and the second patterned wiring 8bb. When a plurality of the light-emitting device 1 are arranged, adjacent LED light-emitting devices 1 may be electrically connected by conductive members, wires for feed wiring (not shown), connectors (not shown), the circuit substrate, or the like. In this case, one power supply unit can supply power to the plurality of light-emitting devices 1 so that all the LED chips 6 of the respective light-emitting devices 1 can emit light.

In brief, the light-emitting device 1 of Embodiment 2 includes the plurality of LED chips 6 on one mounting substrate 2. The mounting substrate 2 of Embodiment 2 has a pair of (two) penetrating wirings (first penetrating wiring 3a and second penetrating wiring 3b) per one LED chip 6. However, in the light-emitting device 1 including the plurality of LED chips 6 on one mounting substrate 2, the mounting substrate 2 may not have one pair of penetrating wirings 3a and 3b per one LED chip 6. For example, the mounting substrate 2 may have one first penetrating wiring 3a on an edge thereof and one second penetrating wiring 3b on the other edge thereof. In this case, when wirings to electrically connect LED chips 6 to each other are formed on the mounting substrate 2 (in the mounting substrate 2), power can be supplied to all the LED chips 6 on the mounting substrate 2 by applying a voltage between the two penetrating wirings 3a and 3b of the mounting substrate 2.

Figure 17A:
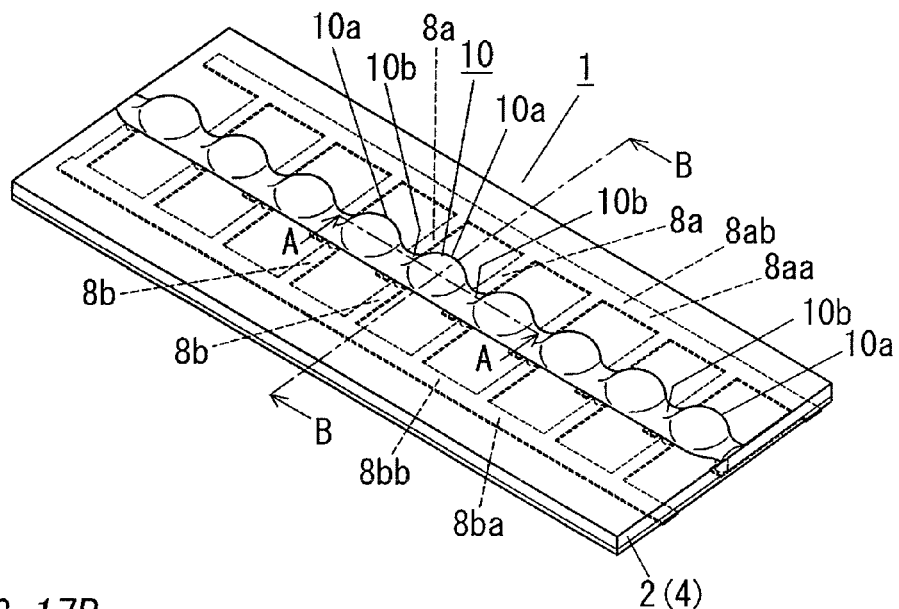
FIG. 17A is a schematic perspective view of a light-emitting device of Embodiment 2.
Figure 17B:
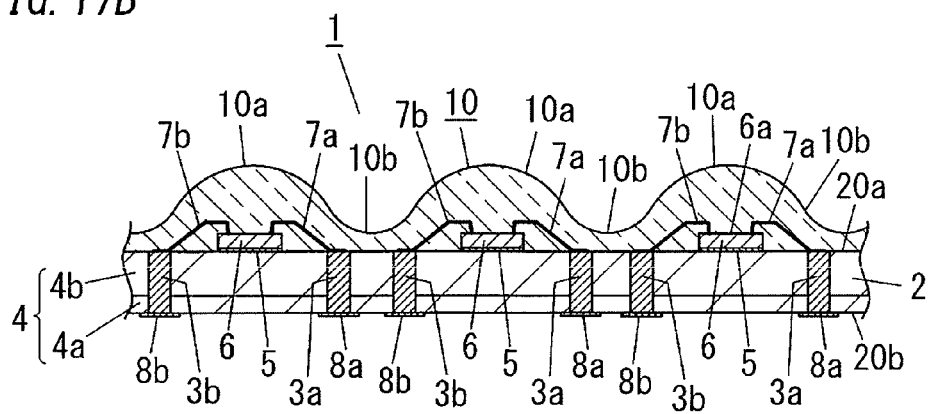
FIG. 17B is a schematic cross-section taken along A-A in FIG. 17A.
Figure 17C:
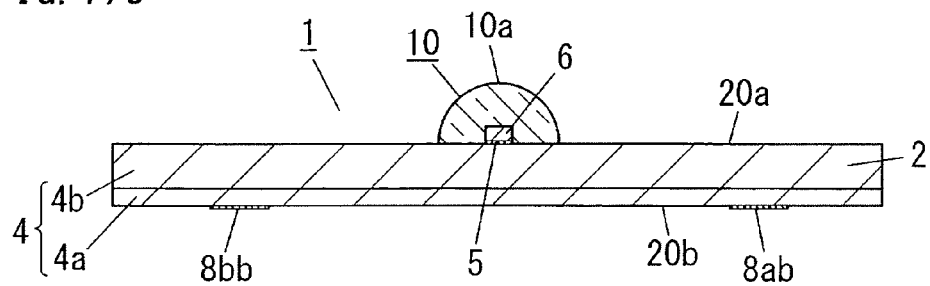
FIG. 17C is a schematic cross-section taken along B-B in FIG. 17A.
Figure 18:
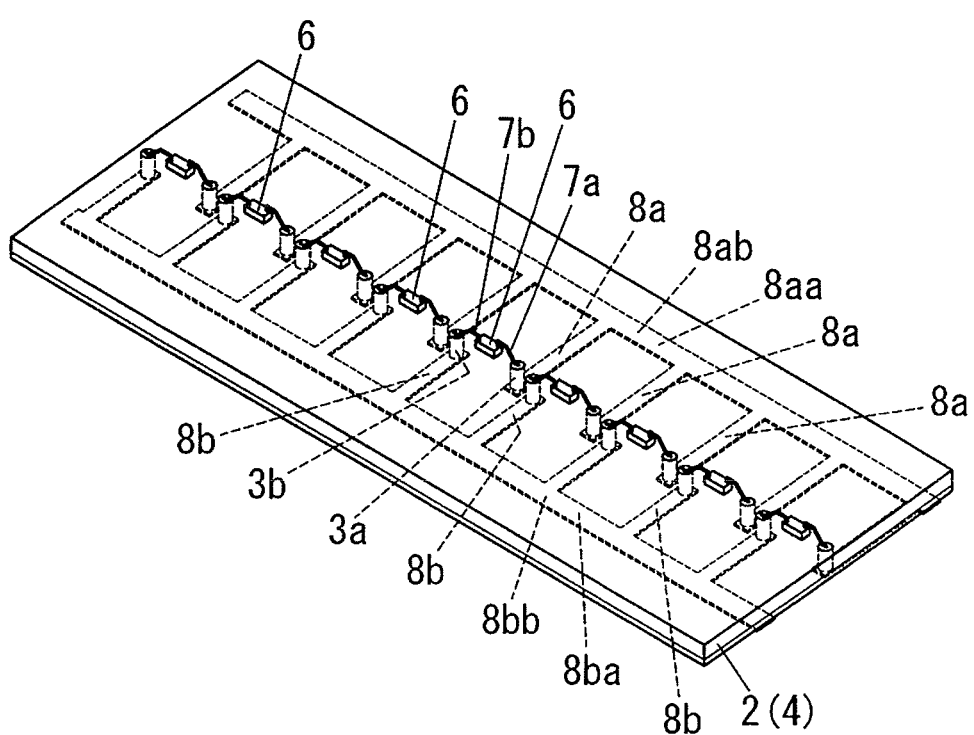
FIG. 18 is a main portion schematic perspective view of the light-emitting device of Embodiment 2.

Besides, in the present embodiment shown in FIG. 17, the mounting substrate 2 is provided with patterned wirings (the first patterned wiring 8ab and the second patterned wiring 8*bb*) electrically connected to the penetrating wirings 3*a* and 3*b*. However, in the light-emitting device 1 including the plurality of LED chips 6 on the mounting substrate 2, the mounting substrate 2 may not be necessarily provided with the patterned wirings. For example, like the LED module 20 shown in FIG. 16, patterned wirings are formed on the wiring substrate 21 on which the light-emitting device 1 is mounted, and the penetrating wirings 3*a* and 3*b* are electrically connected to the patterned wirings on the wiring substrate 21.

The encapsulating portion 10 has, as described above, recessed portions 10*b* to suppress total reflection of light emitted from each of the LED chips 6 between the LED chips 6 which are adjacent to each other in the prescribed direction. Accordingly, in the light-emitting device 1, it is possible to suppress total reflection of light which is emitted from the LED chip 6 and then strikes an interface between the encapsulating portion 10 and air. Consequently, in the light-emitting device 1, it is possible to reduce an amount of light which is confined due to total reflection, compared with the light-emitting device including the encapsulating portion having a hemicylindrical shape, and therefore light outcoupling efficiency can be improved. In short, in the light-emitting device 1, a total reflection loss can be reduced, and light outcoupling efficiency can be improved.

The encapsulating portion 10 is formed so as to have a cross section including a step which corresponds to a step between the face 6*a* of the LED chip 6 and the surface 20*a* of the mounting substrate 2. Consequently, the encapsulating portion 10 has a cross section along a direction orthogonal to the arrangement direction of the LED chips 6, and a cross section along the arrangement direction of the LED chips 6, the former is a convex shape while the latter has recesses and convexes. In short, in the light-emitting device 1, the encapsulating portion 10 with a band shape has a recess and convex structure to improve the light outcoupling efficiency.

The period of the recess and convex structure is the same as the array pitch of the LED chips 6. The period of the recess and convex structure is the array pitch of the convex portions 10*a* of the encapsulating portion 10 which cover respective LED chips 6.

The surface shape of the encapsulating portion 10 may be designed such that the angle between a light ray from the LED chip 6 and a normal line on the surface of the encapsulating portion 10 at a point where the light ray from the LED chip 6 crosses the surface thereof is smaller than the critical angle. Here, in the light-emitting device 1, each of the convex portions 10*a* of the encapsulating portion 10 is preferably designed to have the surface shape such that, in substantially all the areas of the surface of the convex portion 10*a* of the encapsulating portion 10, the incident angle (light incident angle) of the light ray from the LED chip 6 is smaller than the critical angle.

For this reason, in the encapsulating portion 10, each of the convex portions 10*a* which covers a corresponding LED chip 6 is preferably formed in a hemispherical shape. Each convex portion 10*a* is designed such that the light axis of the convex portion 10*a* is aligned with the light axis of the LED chip 6 covered with the convex portion 10*a* in the thickness direction of the submount 4. Accordingly, in the light-emitting device 1, it is possible to suppress not only the total reflection at the surface (interface between the encapsulating portion 10 and air) of the encapsulating portion 10 but also color unevenness. The color unevenness is a state in which chromaticity varies depending on an irradiation direction of light. In the light-emitting device 1, the color unevenness can be suppressed to such an extent the color unevenness cannot be perceived visually.

In the light-emitting device 1, it is possible to substantially equalize light path lengths of light rays from the LED chip 6 to the surface of the convex portion 10*a* regardless the emission direction of light from the LED chip 6. As a result, color unevenness can be further suppressed. The shape of each convex portion 10*a* of the encapsulating portion 10 is not limited to hemisphere, and may be a semielliptical shape, for example. Note that, each convex portion 10*a* may have a shape, a cuboid shape, or the like.

For manufacturing the light-emitting device 1, first, the mounting substrate 2 is prepared. Thereafter, the LED chips 6 are die-bonded on the surface 20*a* of the mounting substrate 2 with a die bonding apparatus or the like. Thereafter, the first electrode and the second electrode of each of the LED chips 6 are connected to the first penetrating wiring 3*a* and the second penetrating wiring 3*b*, respectively, via the first wire 7*a* and the second wire 7*b*, respectively, with a wire bonding apparatus, or the like. Thereafter, the encapsulating portion 10 is formed using a dispenser system or the like.

In a case where the encapsulating portion 10 is formed with a dispenser system, a material of the encapsulating portion 10 is applied by discharging the material from a nozzle while a dispenser head is moved in the arrangement direction of the LED chips 6, for example.

Here, in order to apply the material of the encapsulating portion 10 with the dispenser system so as to form an application shape corresponding to the surface shape of the encapsulating portion 10, the material is discharged and applied while the dispenser head is moved, for example. Specifically, an application amount is varied by varying the moving speed of the dispenser head while the distance between the nozzle and the surface 20*a* of the mounting substrate 2 directly under the nozzle is varied by moving the dispenser head up and down. More specifically, the moving speed of the dispenser head and the discharging speed are relatively varied in applying the material between in a region to form the convex portion 10*a* of the encapsulating portion 10 and in a region to form a portion of the encapsulating portion 10 between adjacent convex portions 10*a*. The moving speed of the dispenser head is slow or the discharging speed is fast in the former region while the moving speed thereof is fast or the discharging speed is slow in the latter region. Moreover, the dispenser head is moved up and down depending on the surface shape of the encapsulating portion 10. Accordingly, by the method of forming the encapsulating portion 10 with the dispenser system, it is possible to form, with the material, the application shape in accordance with the surface shape of the encapsulating portion 10. The application shape may be set in view of contraction in curing the material.

The dispenser system preferably includes: a movement mechanism constituted by a robot for moving the dispenser head; a sensor unit for measuring heights of the surface 20*a* of the mounting substrate 2 and the nozzle from a table; and a controller for controlling the movement mechanism and a discharging speed of the material from the nozzle. The controller can be realized, for example, by loading an appropriate program to a microcomputer. The dispenser system can be adapted to various types of products different in the array pitch of the LED chips 6, the number of the LED chips 6, the width of the encapsulating portion 10, or the like, by changing the program loaded to the controller appropriately.

The surface shape of the encapsulating portion 10 can be controlled by adjusting viscosity, thixotropy, or the like of the material, for example. The curvature of the surface (convex face) in each of the convex portions 10a can be designed with viscosity, thixotropy, and surface tension of the material, a height of the wire 7, or the like. Larger curvature can be realized by increasing the viscosity and the surface tension of the material, or by increasing the height of the wire 7. A smaller width (band width) of the encapsulating portion 10 having the band shape can be realized by increasing the viscosity, the thixotropy, and the surface tension of the material. The viscosity of the material is preferably set to be in a range of around 100 to 50000 mPa·s. Note that, the value of the viscosity may be measured under a room temperature using a cone and plate rotational viscometer, for example.

The dispenser system may include a heater to heat an un-cured material so as to adjust the viscosity thereof to a desirable value. Accordingly, in the dispenser system, reproducibility of the application shape of the material can be improved, and reproducibility of the surface shape of the encapsulating portion 10 can be improved.

Figure 19:
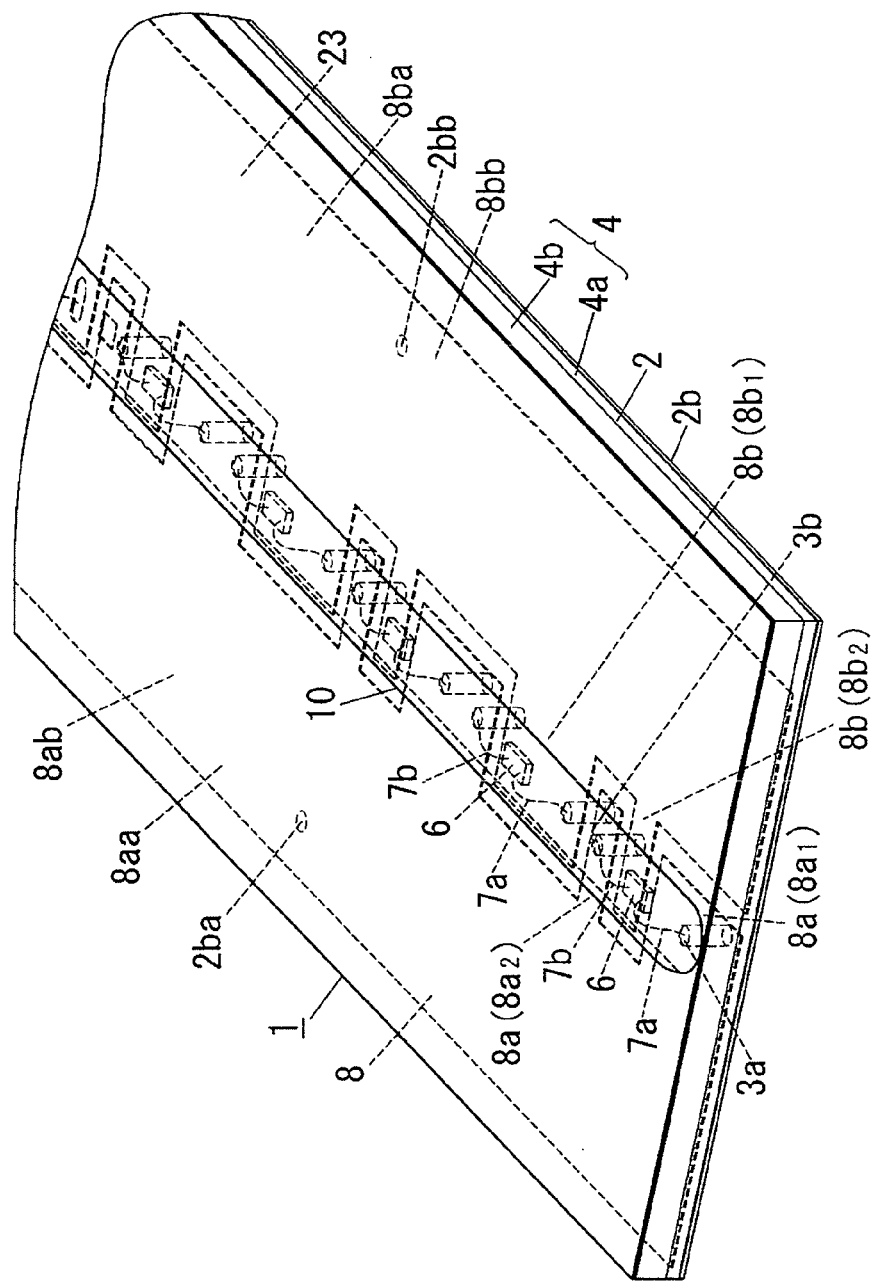
FIG. 19 is a schematic perspective view of a modification of the light-emitting of Embodiment 2 with a partial cutaway thereof.
Figure 20:
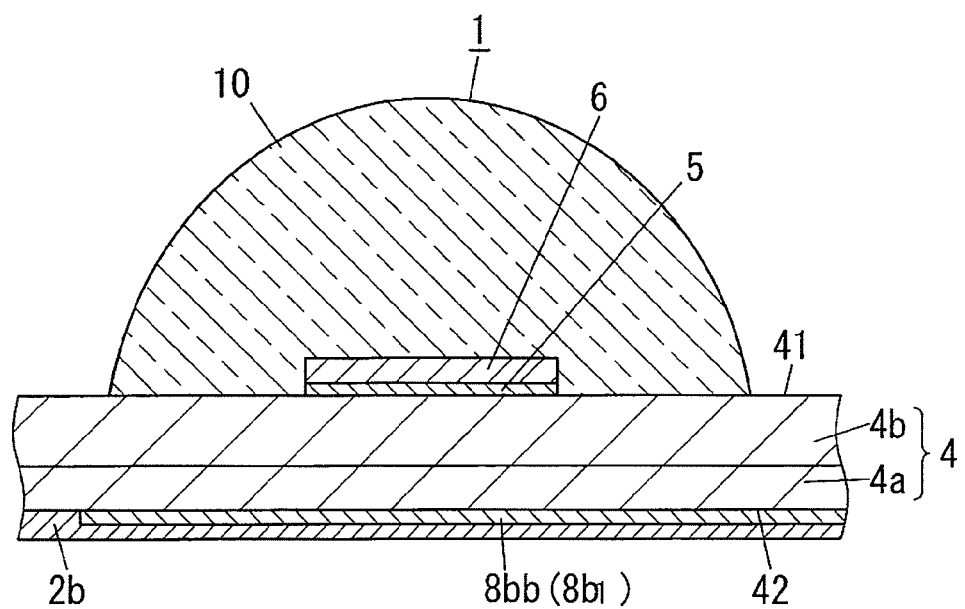
FIG. 20 is a schematic perspective view of the modification of the light-emitting of Embodiment 2.

Hereinafter, a modification of the light-emitting device 1 of the present embodiment will be described with reference to FIGS. 19 and 20. Note that, constituent elements similar to those in Embodiment 2 are provided with the same reference numerals, and redundant description thereof will be omitted appropriately.

In the light-emitting device 1, a plurality of LED chips 6 are arranged on the surface 20a of the mounting substrate 2 in a prescribed direction (hereinafter, referred to as "first direction") at equal intervals.

The first patterned wiring 8ab and the second patterned wiring 8bb constitute patterned conductors 8 serving as a circuit 23. The first patterned wiring 8ab and the second patterned wiring 8bb are each formed into a comb shape and interdigitate. The first patterned wiring 8ab is electrically connected to the first electrode of each of the LED chip 6 via the first wire 7a. The second patterned wiring 8bb is electrically connected to the second electrode of each of the LED chip 6 via the second wire 7b.

The first patterned wiring 8ab includes a first shaft 8aa formed along the first direction and a plurality of first comb teeth (first external electrodes) 8a which are formed along a second direction orthogonal to the first direction.

The second patterned wiring 8bb includes a second shaft 8ba which is formed along the first direction and a plurality of second comb teeth (second external electrodes) 8b which are formed along the second direction.

The plurality of first comb teeth 8a of the first patterned wiring 8ab are constituted by first comb teeth 8a ($8a_1$) having a relatively large tooth width and first comb teeth 8a ($8a_2$) having a relatively small tooth width. In the first patterned wiring 8ab, the wide first comb teeth $8a_1$ and the narrow first comb teeth $8a_2$ are arranged alternately in the first direction.

The plurality of second comb teeth 8b of the second patterned wiring 8bb are constituted by second comb teeth 8b ($8b_1$) having a relatively large tooth width and second comb teeth 8b ($8b_2$) having a relatively small tooth width. In the second patterned wiring 8bb, the wide second comb teeth $8b_1$ and the narrow second comb teeth $8b_2$ are arranged alternately in the first direction.

The patterned conductors 8 include the wide first comb teeth $8a_1$, the narrow second comb teeth $8b_2$, the narrow first comb teeth $8a_2$, and the comb teeth $8b_1$ which are arranged cyclically in the first direction.

Note that, in the mounting substrate 2 of the present modification, the patterned conductors 8 is formed on a surface of the light-transmissive member 4 having an electrical insulation property, and a mask layer 2b which covers the patterned conductors 8 over the surface of the light-transmissive member 4. The mask layer 2b is formed over the surface of the light-transmissive member 4 so as to also cover portions in which the patterned conductors 8 are not formed. The material of the mask layer 2b may be a white mask made of a resin (such as silicone resin) which contains a white pigment such as barium sulfate ($BaSO_4$) and titanium dioxide ($TiO_2$). The white mask may be a white mask material "ASA COLOR (registered trademark) RESIST INK" made of silicone produced by Asahi Rubber Inc., or the like. In this regard, on the mounting substrate 2, the mask layer 2b may not be formed. It is optional whether the mask layer 2b is provided on the mounting substrate 2 or not.

The mask layer 2b has an opening 2ba for exposing a first pad (a first electrode terminal) on the first patterned wiring 8ab to which the first wire 7a is electrically connected and an opening 2bb for exposing a second pad (second electrode terminal) on the second patterned wiring 8bb to which the respective second wire 7b is electrically connected. In the mask layer 2b, the opening 2ba and the opening 2bb may be aligned in a direction. In the mask layer 2b, a plurality of the openings 2ba and a plurality of the openings 2bb may be formed. In this case, in the mask layer 2b, the plurality of the openings 2ba and the plurality of the openings 2bb are arranged alternately in the first direction.

When the opening 2ba for exposing the first pad is formed on one of the wide first comb teeth $8a_1$ the opening 2ba is located at a distant side from the narrow second comb tooth $8b_2$ adjacent to the wide first comb tooth $8a_1$ with respect to the center line of the wide first comb tooth $8a_1$ in the first direction, for example. In this case, in the LED module 20, the LED chip 6 is provided vertically above a region on the wide first comb tooth $8a_1$ that is closer to the narrow second comb tooth $8b_2$ than to the center line.

When the opening 2ba for exposing the first pad on one of the narrow first comb teeth $8a_2$. the opening 2ba is located on the center line of the narrow first comb tooth $8a_2$.

When the opening 2bb for exposing the second pad on one of the wide second comb teeth $8b_1$, the opening 2bb is located at a distant side from the narrow first comb tooth $8a_2$ adjacent to the second comb tooth $8b_1$ with respect to the center line of the wide second comb tooth $8b_1$ in the first direction. In the LED module 20, the LED chip 6 is provided vertically above a region on the wide second comb tooth $8b_1$ that is closer to the narrow first comb tooth $8a_2$ than to the center line.

When the opening 2bb for exposing the second pad on the one of narrow second comb teeth $8b_2$, the opening 2bb is located on the center line of the narrow second comb tooth $8b_2$. Each LED chip 6 is located between, in a planar view, the first pad to which the first electrode is connected via the first wire 7a and the second pad to which the second electrode is connected via the second wire 7b. In short, in the light-emitting device 1, the plurality of LED chips 6, the plurality of first pads, and the plurality of second pads are formed so as to be aligned on a line in a planar view.

The encapsulating portion 10 is formed in a band shape to cover the plurality of LED chips 6, the plurality of first wires 7a, and the plurality of second wires 7b. The cross section of the encapsulating portion 10 along a direction orthogonal to the first direction is a hemispherical shape. The encapsulating portion 10 may have a similar shape to that of Embodiment 2.

In the light-emitting device 1, the patterned conductors 8 are present on the mounting substrate 2 to overlap respective vertical projection regions of the LED chips 6. In the light-emitting device 1, heat generated in lighting the LED chips 6 and the encapsulating portions 10 can thereby be conducted to a wide area via the patterned conductors 8. That is, in the modification of the light-emitting device 1, a heat dissipation property can be improved, and light output can be increased. In the light-emitting device 1, since the directions of the LED chips 6 can be made the same, handling of the LED chips 6 in bonding process of the LED chips 6 on the mounting substrate 2 can be facilitated, and manufacturing can be facilitated.

Note that the light-emitting device 1 is not limited to the above-described examples. For example, the first wire 7a and the second wire 7b may extend along a direction perpendicular to the arrangement direction of the LED chips 6, and each of the encapsulating portions 10 may have a hemispherical shape to cover the LED chip 6 and portions of the first wire 7a and the second wire 7b.

Incidentally, the light-emitting devices 1 of Embodiments 1 and 2 can be used as a light source for a variety of lighting apparatuses. The lighting apparatus including the light-emitting device 1 may be a lighting fixture including the light-emitting device 1 as a light source and a fixture body to hold the light source, for example. The fixture body is preferably made of a metal having high thermal conductivity such as aluminum and copper. In the lighting fixture, when the fixture body is made of metal, it is possible to efficiently release heat generated in the light-emitting device 1.

Figure 21A:
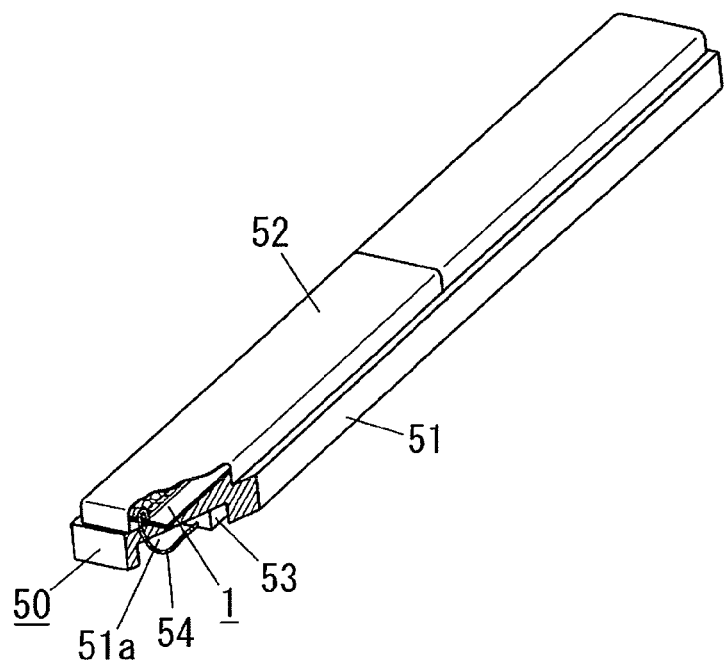
FIGS. 21A and 21B show an example of a lighting fixture including a light-emitting device of any Embodiment, FIG. 21A being a schematic perspective view of the lighting fixture with a partial cutaway thereof, and FIG. 21B being an enlarged view of a main portion shown in FIG. 21A.
Figure 21B:
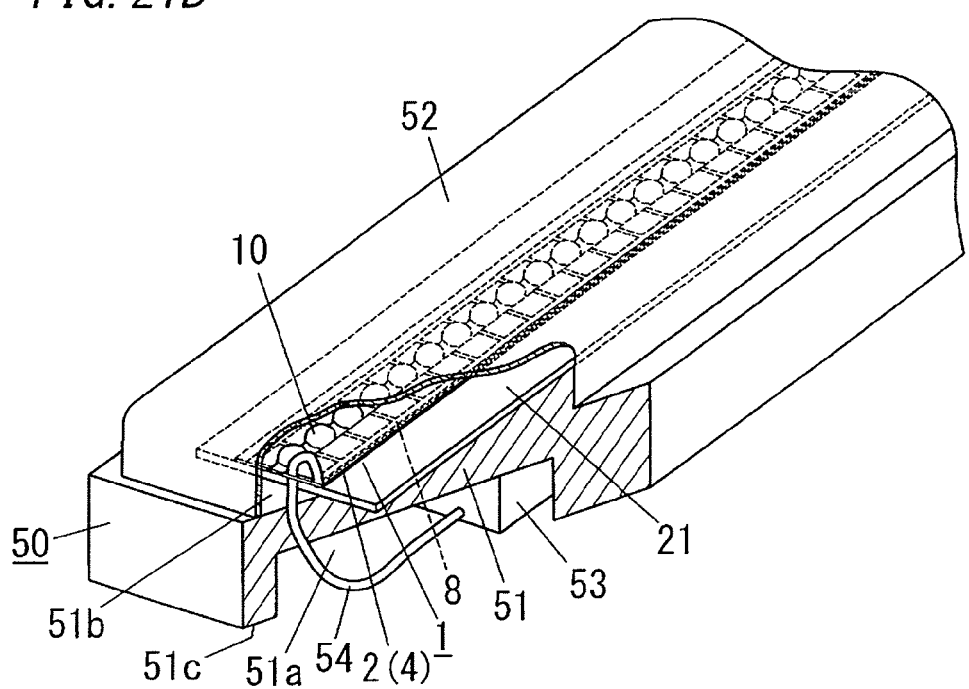

Hereinafter, a lighting fixture 50 including the light-emitting device 1 of Embodiment 2 as a light source will be described with reference to FIGS. 21A and 21B.

The lighting fixture 50 is an LED lighting fixture and includes a fixture body 51 and the light-emitting device 1 serving as a light source held by the fixture body 51.

The fixture body 51 is formed in an elongated shape (rectangle plate shape, here) and is larger than the light-emitting device 1 in a planar size. In the lighting fixture 50, the light-emitting device 1 is provided on a surface 51b of the fixture body 51 in the thickness direction. In the lighting fixture 50, the light-emitting device 1 and the fixture body 51 are arranged such that the longitudinal direction of the light-emitting device 1 is aligned with the longitudinal direction of the fixture body 51. The lighting fixture 50 includes a cover 52 for covering the light-emitting device 1 provided on the surface 51b of the fixture body 51. The cover 52 transmits light which is emitted from the light-emitting device 1.

The lighting fixture 50 includes a lighting unit 53 which supplies direct current electric power to the light-emitting device 1 for lighting (allowing light emission) each of the LED chips 6. In the lighting fixture 50, the lighting unit 53 and the light-emitting device 1 are electrically connected via wires 54 e.g., lead wires.

In the lighting fixture 50, at a further surface 51c of the fixture body 51 in the thickness direction, a recess 51a is formed to house the lighting unit 53. The recess 51a is formed along the longitudinal direction of the fixture body 51. Also, the fixture body 51 has a through hole (not shown) to which the wire 54 is to be inserted. The through hole penetrates a thin portion between the surface 51b and the inner bottom face of the recess 51a.

In the light-emitting device 1, the wires 54 can be connected to exposed portions of the patterned conductors 8. A connection portion between the patterned conductor 8 and the wire 54 may be a connection portion composed of a conductive bonding material such as solder, a connection portion constituted by a male connector and a female connector, or the like.

In the lighting fixture 50, the light-emitting device 1 can be lighted with direct current electric power supplied from the lighting unit 53. Note that, the lighting unit 53 may receive power from an alternating current power supply such as a commercial power supply, or receive electric power from a direct current power supply such as a solar cell and a storage battery.

The light source in the lighting fixture 50 is not limited to the light-emitting device 1 of Embodiment 2, but may be the light-emitting device 1 of Embodiment 1.

The fixture body 51 is preferably made of a material having high thermal conductivity, and is more preferably made of a material having higher thermal conductivity than the mounting substrate 2. Here, the fixture body 51 is preferably made of a metal having high thermal conductivity such as aluminum and copper.

The light-emitting device 1 may be fixed to the fixture body 51 by: a method using a fixture such as a screw; or bonding the fixture body 51 to the light-emitting device 1 by providing therebetween an epoxy resin layer which is a thermoset sheet adhesive. The sheet adhesive may be a sheet adhesive made of a stack of a plastic film (PET film) and a B stage epoxy resin layer (thermoset resin). The B stage epoxy resin layer contains a filling material composed of a filler such as silica and alumina and has a property in which viscosity becomes small and fluidity becomes large when heated. Such a sheet adhesive may be an adhesive sheet TSA available from Toray Industries, Inc. or the like. The filler may be an electrical insulation material having high thermal conductivity than an epoxy resin which is a thermoset resin. The thickness of the aforementioned epoxy resin layer is set to be 100 μm, but this value is an example, and the thickness is not limited thereto, and may be set in a range of around 50 μm to 150 μm as appropriate. The thermal conductivity of the aforementioned epoxy resin layer is preferably larger than 4 W/m·K.

The epoxy resin layer which is a sheet adhesive described above has high thermal conductivity, high fluidity when heated, and high adhesiveness to a surface having asperity, along with having an electrical insulation property. Consequently, in the lighting fixture, it is possible to prevent generation of gaps between the aforementioned insulation layer of the epoxy resin layer and the light-emitting device 1 and between the insulation layer and the fixture body 51, and as a result it is possible to improve adhesion reliability and to suppress an increase of a thermal resistance and occurrence of variation due to lack of adhesion. The insulation layer has an electrical insulation property and thermal conductivity, and has a function of connecting the light-emitting device 1 and the fixture body thermally.

Thus, in the lighting fixture, it is possible to lower a thermal resistance between each LED chip 6 and the fixture body and reduce a variation of thermal resistances, compared with a lighting fixture where a heat dissipation sheet (heat conduction sheet) of a rubber sheet type or a silicone gel type such as Sarcon (registered trademark) is interposed between the light-emitting device 1 and the fixture body. Accordingly, in the lighting fixture, since the heat dissipation property is improved and therefore an increase in junction temperature of each of the LED chips 6 can be suppressed. Hence, input power can be increased and light output can be increased.

The cover 52 may be made of an acrylic resin, a polycarbonate resin, a silicone resin, glass, or the like.

The cover 52 has a lens portion (not shown) which is formed integrally therewith and controls a directional distribution of light emitted from the light-emitting device 1. Cost can be reduced compared with a configuration in which a lens which has been separately prepared from the cover 52 is attached to the cover 52.

The lighting fixture 50 described above includes the light-emitting device 1 serving as the light source, and therefore cost thereof can be reduced and light output thereof can be increased.

The lighting fixture 50 includes the fixture body 51 made of metal, and therefore the heat dissipation property thereof can be improved.

The lighting apparatus which includes the light-emitting device 1 may be, for another example, a straight-tube LED lamp. Note that, in terms of the straight-tube LED lamp, "straight-tube LED lamp system with L-type pin cap GX16t-5 (for general illumination)" (JEL 801) is standardized by Japan Electric Lamp Manufacturers Association, for example.

Figure 22A:
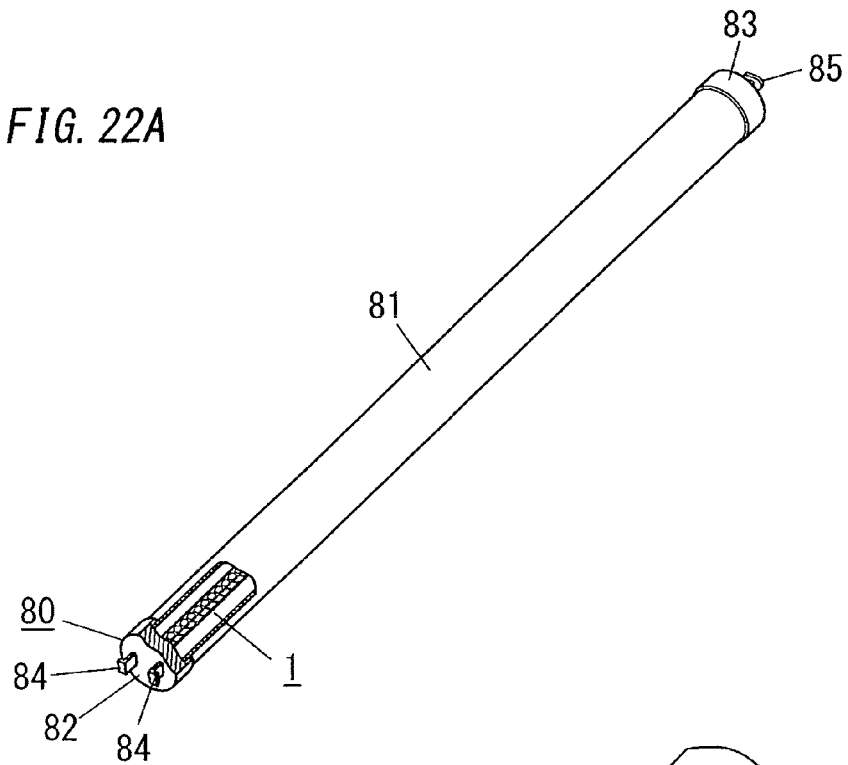
FIGS. 22A and 22B show an example of a lighting fixture including a light-emitting device of any Embodiment, FIG. 22A being a schematic perspective view of the lighting fixture with a partial cutaway thereof, and FIG. 22B being an enlarged view of a main portion shown in FIG. 22A.
Figure 22B:
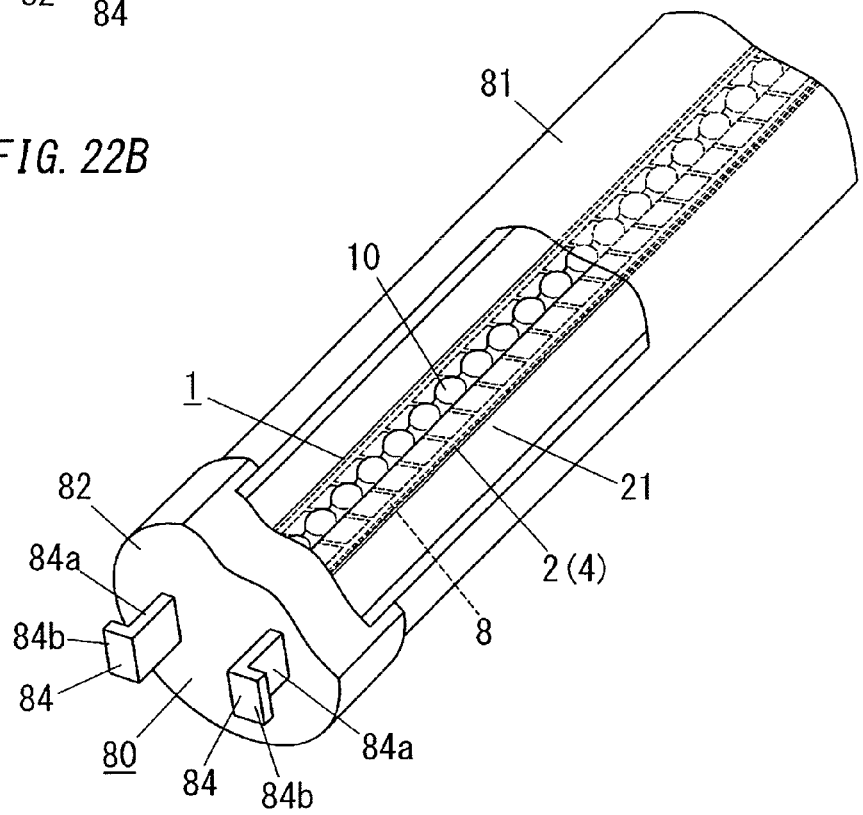

Hereinafter, a straight-tube LED lamp 80 including a light source that is the light-emitting device 1 of Embodiment 2 will be described with reference to FIGS. 22A and 22B.

The straight-tube LED lamp 80 includes: a tube main body 81 having a straight-tube shape (cylindrical shape) formed of a light-transmissive material; and a first cap 82 and a second cap 83 that are respectively provided at an end portion and the other end portion of the tube main body in the longitudinal direction. The light-emitting device 1 of Embodiment 2 is housed in the tube main body 81. The light-emitting device 1 is not limited to the light-emitting device 1 of Embodiment 2, but may be the light-emitting device 1 of Embodiment 1. Note that, in terms of a general straight-tube LED lamp, "straight-tube LED lamp system with L-type pin cap GX16t-5 (for general illumination)" (JEL 801:2010) is standardized by Japan Electric Lamp Manufacturers Association, for example.

The tube main body 81 may be made of transparent glass, milky white glass, a transparent resin, a milky white resin, or the like.

The first cap 82 has two power supply terminals 84 and 84 (hereinafter referred to as "first lamp pins") which are electrically connected to the light-emitting device 1. These two first lamp pins 84 and 84 are configured to be electrically connected to two power supply contacts respectively of a lamp socket for a power supply which is held in the fixture body of a lighting fixture (not shown).

The second cap 83 has one grounding terminal 85 (hereinafter referred to as "second lamp pin") for grounding. This one second lamp pin 85 is configured to be electrically connected to a grounding contact of a lamp socket for grounding which is held in the fixture body.

Each of the first lamp pins 84 is formed in an L-shape, and is constituted by a pin main body 84a which protrudes along the longitudinal direction of the tube main body 81 and a key portion 84b which extends along the radial direction of the tube main body 81 from the tip of the pin main body 84a. The two key portions 84b extend in directions so as to be farther from each other. Note that each of the first lamp pins 84 is formed by bending a long metal plate.

The second lamp pin 85 protrudes from an end face (cap reference face) of the second cap 83 in the opposite direction to the tube main body 81. The second lamp pin 85 is formed in a T-shape. Note that the straight-tube LED lamp 80 is preferably configured so as to meet the standard of "straight-tube LED lamp system with L-type pin cap GX16t-5 (for general illumination)" (JEL 801:2010) which is standardized by Japan Electric Lamp Manufacturers Association, or the like.

The straight-tube LED lamp 80 as described above includes the aforementioned light-emitting device 1 in the tube main body 81, and therefore cost thereof can be reduced and light output thereof can be increased.

A lamp which includes the light-emitting device 1 is not limited to the aforementioned straight-tube LED lamp, and may be a straight-tube LED lamp including the light-emitting device 1 and a lighting unit to switch on the light-emitting device 1 both in the tube main body. Note that power is supplied to the lighting unit from an external power supply via lamp pins.

The light-emitting device 1 of Embodiment 2 includes the mounting substrate 2 having an elongated shape and a plurality of the LED chips 6, but the shape of the mounting substrate 2 and the number of LED chips 6 and arrangement of the LED chips 6 can be changed as appropriate depending on the type or the like of the lighting fixture to which the light-emitting device 1 is applied.

In brief, the straight-tube LED lamp described above may include: the tube main body 81 having a straight-tube shape and made of the light-transmissive material (e.g., milky white glass and a milky white resin); and the first cap 82 and the second cap 83 which are respectively provided at an end and the other end of the tube main body 81 in the longitudinal direction. The light-emitting device 1 may be accommodated in the tube main body 81. The mounting substrate 2 has an elongated shape, and a plurality of LED chips 6 may be aligned along the longitudinal direction of the mounting substrate 2. In the straight-tube LED lamp, the LED module 20 (see, FIG. 16) described in Embodiment 1 may be accommodated in the tube main body 81, for example.

Figure 23:
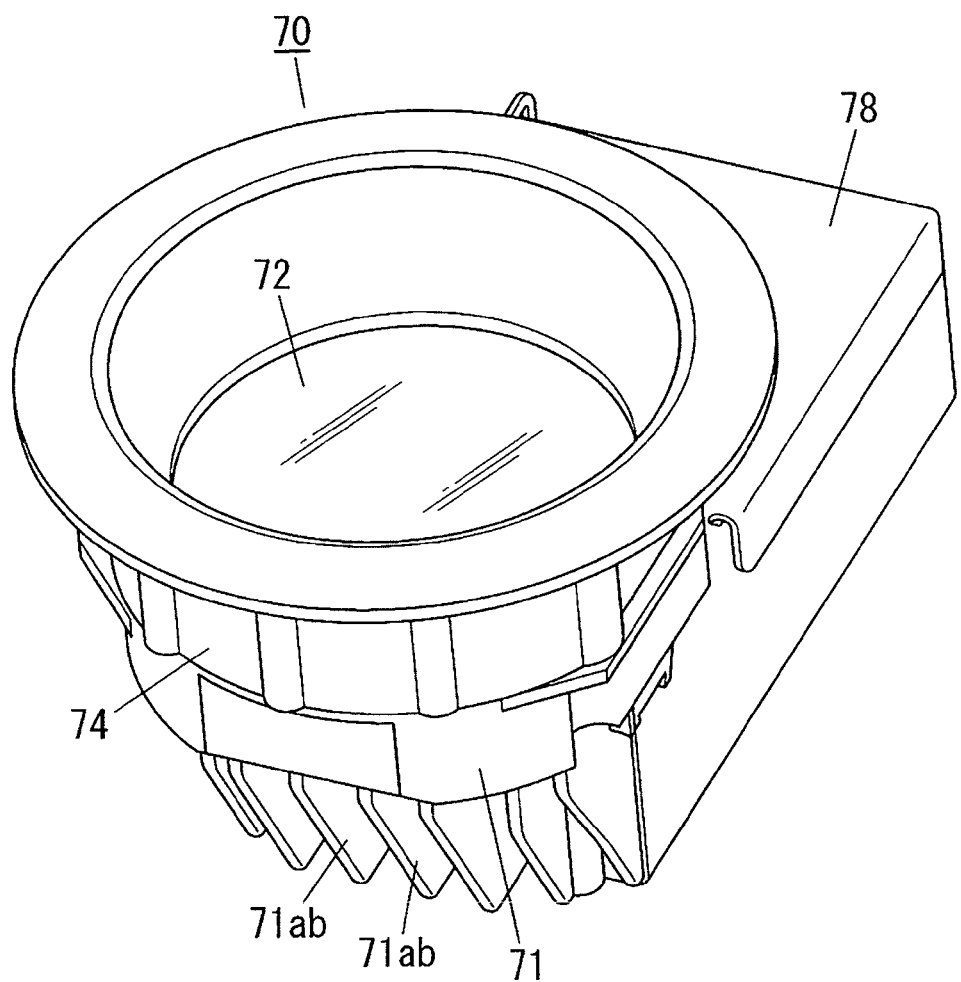
FIG. 23 is a schematic perspective view of an example of a lighting fixture including the light-emitting device of any Embodiment.
Figure 24:
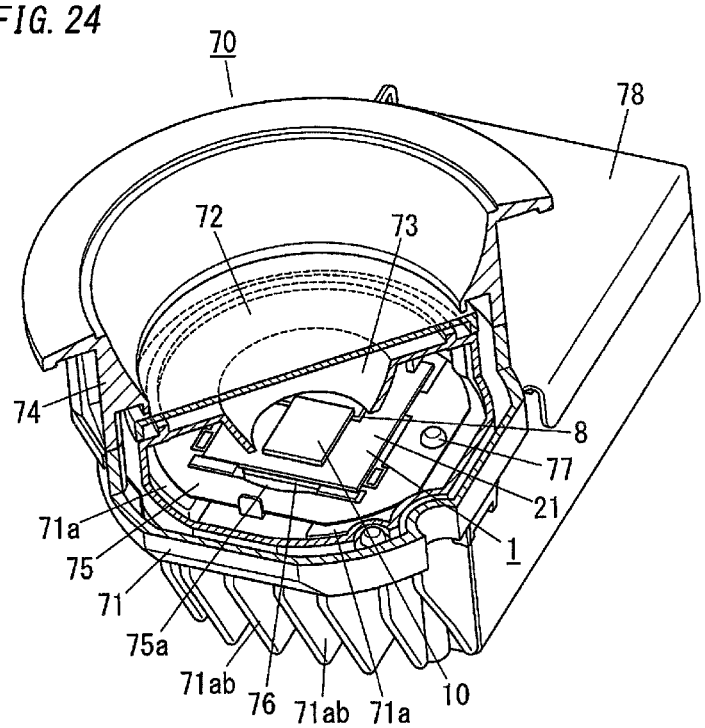
FIG. 24 is a schematic perspective view of the example of the lighting fixture including the light-emitting device of any Embodiment, which is partially exploded.
Figure 25:
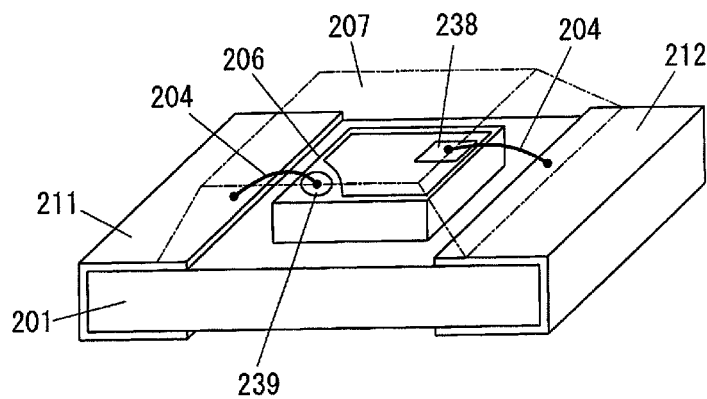
FIG. 25 is a perspective explanatory diagram of a chip-type light-emitting element of a conventional example.

Hereinafter, an example of another lighting fixture 70 including the light-emitting device 1 will be described with reference to FIGS. 23 and 24.

The lighting fixture 70 is an LED lighting fixture which can be used as a downlight, and includes a fixture body 71 and a light source that is the light-emitting device 1 and is held by the fixture body 71. Besides, the lighting fixture 70 includes a case 78 which has a rectangular box shape and accommodates a lighting unit to operate the light-emitting device 1. The lighting unit and the light-emitting device 1 are electrically connected by wires (unshown) or the like.

In the lighting fixture 70, the fixture body 71 is formed in a disk shape, and the light-emitting device 1 is present on a face of the fixture body 71. The lighting fixture 70 includes a plurality of fins 71ab which protrude from a further face of the fixture body 71. The fixture body 71 and the fins 71ab are formed integrally.

The light-emitting device 1 is provided on a wiring substrate 21, which is in the form of a rectangular plate. Besides, the light-emitting device 1 includes a plurality of LED chips (not shown) arranged in a two-dimensional array and an encapsulating portion 10 to collectively encapsulate all the plurality of LED chips.

Moreover, the lighting fixture 70 includes a first reflector 73 to reflect light which is emitted laterally from the light-emitting device 1, a cover 72, and a second reflector 74 to control a directional distribution of light which is outputted from the cover 72. Note that, in the lighting fixture 70, an outer cover to house the light-emitting device 1, the first reflector 73, and the cover 72 is constituted by the fixture body 71 and the second reflector 74.

The fixture body 71 has two projecting base portions 71a, which face each other, on the face (the face on which the light-emitting device 1 is to be provided). In the lighting fixture 70, a plate shaped fixing member 75 to fix the light-emitting device 1 is attached to the two projecting base portions 71a. The fixing member 75 is formed of a metal plate, and is fixed to each of the projecting base portions 71a by a screw 77. The first reflector 73 is fixed to the fixture body 71. The light-emitting device 1 may be sandwiched between the first reflector 73 and the fixing member 75. The first reflector 73 is formed of a white synthetic resin.

The fixing member 75 has an opening 75a for exposing part of the wiring substrate 21. The lighting fixture 70 includes a thermal conduction portion 76 interposed between the wiring substrate 21 and the fixture body 71. The thermal conduction portion 76 has a function of conducting heat from the wiring substrate 21 to the fixture body 71. The thermal conduction portion 76 is formed of a heat-conductive grease, but is not limited thereto, and may be formed of a heat-conductive sheet.

The heat-conductive sheet may be a silicone gel sheet having electrical insulation and thermal conductivity. The silicone gel sheet used as the heat-conductive sheet is preferably soft. This king of silicone gel sheet may be Sarcon (registered trademark) or the like.

The material of the heat-conductive sheet is not limited to silicone gel, and may be elastomer, for example, so long as the material has electrical insulation and thermal conductivity.

In the lighting fixture 70, heat generated in the light-emitting device 1 can be efficiently conducted to the fixture body 71 via the thermal conduction portion 76. Consequently, in the lighting fixture 70, heat generated in the light-emitting device 1 can be efficiently released from the fixture body 71 and the fins 71ab.

The fixture body 71 and the fins 71ab are preferably formed of a material having high thermal conductivity, and more preferably made of a material having higher thermal conductivity than the mounting substrate 2. Here, the fixture body 71 and the fins 71ab are preferably formed of a metal having high thermal conductivity such as aluminum and copper.

The cover 72 may be made of an acrylic resin, a polycarbonate resin, a silicone resin, glass, or the like.

The cover 72 may has a lens portion (not shown) for controlling a directional distribution of light emitted from the light-emitting device 1. The cover 72 and the lens portion may be formed integrally.

The second reflector 74 may be made of aluminum, stainless steel, a resin, ceramic, or the like.

The lighting fixture 70 described above includes a light source that is the aforementioned light-emitting device 1, and therefore cost can be reduced and light output can be increased. Besides, the lighting fixture 70 may have a configuration in which the fixture body 71 also serves as the wiring substrate 21. That is, the light-emitting device 1 may be fixed directly to the fixture body 71 without providing the wiring substrate 21 in between.

The invention claimed is:

1. A light-emitting device comprising:
   a mounting substrate having a first surface and a second surface facing the first surface;
   an LED chip bonded to the first surface with a bond; and
   an encapsulating portion covering the LED chip on the first surface, wherein the bond allows light emitted from the LED chip to pass therethrough,
   the mounting substrate includes:
      a light-transmissive member having a planar size larger than a planar size of the LED chip;
      a first penetrating wiring, which penetrates the light-transmissive member in a thickness direction of the light-transmissive member and is electrically connected to a first electrode of the LED chip via a first wire;
      a second penetrating wiring, which penetrates the light-transmissive member in the thickness direction and is electrically connected to a second electrode of the LED chip via a second wire; and
      a first external electrode and a second external electrode disposed on the second surface of the mounting substrate, and configured to supply electric power to the LED chip,
   the first penetrating wiring is electrically connected to the first external electrode, and the second penetrating wiring is electrically connected to the second external electrode,
   the first electrode of the LED chip is directly connected to the first penetrating wiring via the first wire, and
   the second electrode of the LED chip is directly connected to the second penetrating wiring via the second wire,
   the encapsulating portion covers the first wire and the second wire, the light-transmissive member being constituted by a first ceramic layer and a second ceramic layer, which are stacked in the thickness direction, the first ceramic layer and the second ceramic layer being arranged from the LED chip in order of the first ceramic layer and the second ceramic layer, the first ceramic layer being thicker than the second ceramic layer, the first ceramic layer including ceramic particles having a greater particle diameter than ceramic particles of the second ceramic layer, the ceramic particles of the second ceramic layer further including pores, and the first ceramic layer and the second ceramic layer having different optical properties,
   the second ceramic layer being disposed farther from the LED chip and being higher in reflectance to the light emitted from the LED chip than the first ceramic layer,
   the first ceramic layer configured to refract the light transmitted from the LED chip to modify its trajectory from its entry to prevent the light from being reflected back towards the LED chip,
   the second ceramic layer configured to further refract the light to direct the received light away from the second surface of the mounting substrate,
   the LED chip being bonded to one surface of the light-transmissive member via the bond, and
   the light-transmissive member having translucency and diffusibility to the light that is emitted from the LED chip.

2. The light-emitting device according to claim 1, wherein the light-transmissive member allows light, which is emitted from the LED chip and enters the light-transmissive member, to be diffusely reflected at an interface between the first ceramic layer and the second ceramic layer.

3. The light-emitting device according to claim 1, wherein:
   the light-transmissive member allows light to be diffused at the second ceramic layer.

4. The light-emitting device according to claim 1, wherein:
   the first ceramic layer has a higher light transmittance than the second ceramic layer; and
   the second ceramic layer has a higher light scattering rate than the first ceramic layer.

5. The light-emitting device according to claim 1, wherein:
the first ceramic layer is thicker than the second ceramic layer.

6. The light-emitting device according to claim 1, wherein:
the second ceramic layer is formed by sintering at a lower temperature than a temperature for sintering of the first ceramic layer.

7. The light-emitting device according to claim 6, wherein:
the first ceramic layer is formed by sintering at a temperature of 1500° C. or more but 1600° C. or less; and
the second ceramic layer is formed by sintering at a temperature of 850° C. or more but 1000° C. or less.

8. The light-emitting device according to claim 1, wherein:
the encapsulating portion contains a transparent material and a wavelength conversion material; and
the wavelength conversion material is a fluorescent material which is excited by the light emitted from the LED chip to emit light having a different color from a color of the light emitted from the LED chip.

* * * * *